(12) United States Patent
Hiew et al.

(10) Patent No.: US 8,102,658 B2
(45) Date of Patent: Jan. 24, 2012

(54) MICRO-SD TO SECURE DIGITAL ADAPTOR CARD AND MANUFACTURING METHOD

(75) Inventors: Siew S. Hiew, San Jose, CA (US); Abraham C. Ma, Fremont, CA (US); Nan Nan, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 207 days.

(21) Appl. No.: 12/649,233

(22) Filed: Dec. 29, 2009

(65) Prior Publication Data
US 2010/0105251 A1    Apr. 29, 2010

Related U.S. Application Data

(63) Continuation-in-part of application No. 11/773,830, filed on Jul. 5, 2007, now Pat. No. 7,872,871, and a continuation-in-part of application No. 11/831,888, filed on Jul. 31, 2007, now Pat. No. 7,830,666, and a continuation-in-part of application No. 12/175,753, filed on Jul. 18, 2008, now abandoned.

(51) Int. Cl.
*H05K 7/02* (2006.01)

(52) U.S. Cl. .......... 361/737; 439/945; 439/946; 29/830; 235/492

(58) Field of Classification Search .................. 361/737, 361/752; 439/630, 945, 946; 235/492; 29/830; 257/679
See application file for complete search history.

(56) References Cited

U.S. PATENT DOCUMENTS

| | | | |
|---|---|---|---|
| 5,397,857 A | 3/1995 | Farquhar et al. |
| 5,404,485 A | 4/1995 | Ban |
| 5,414,597 A | 5/1995 | Lindland et al. |
| 5,430,859 A | 7/1995 | Norman et al. |
| 5,479,638 A | 12/1995 | Assar et al. |
| 5,530,622 A | 6/1996 | Takiar et al. |
| 5,563,769 A | 10/1996 | MacGregor |
| 5,623,552 A | 4/1997 | Lane |
| 5,821,614 A | 10/1998 | Hashimoto et al. |
| 5,835,760 A | 11/1998 | Harmer |
| 5,891,483 A | 4/1999 | Miyajima |
| 5,959,541 A | 9/1999 | DiMaria et al. |

(Continued)

OTHER PUBLICATIONS

USB 'A' Plug Form Factor, Revision 0.9, Guideline for Embedded USB Device Applications, Nov. 29, 2004, 4 pages.

(Continued)

*Primary Examiner* — Dameon Levi

(74) *Attorney, Agent, or Firm* — Bever, Hoffman & Harms, LLP; Patrick T. Bever

(57) ABSTRACT

A microSD-to-SD adaptor card includes a base substrate having a lead frame structure, a protective cap forming a chamber that encloses eight microSD contact pins of the lead frame structure, and a thermoset plastic casing formed over the protective cap and exposed portions of the base substrate to provide the adaptor card with standard SD card dimensions. A rear opening facilitates insertion of a standard microSD card, whereby the eight contact pads on the microSD card are contacted by the eight microSD contact pins inside the chamber to allow electrical signals generated by the microSD card to be transmitted to a host system by way of a standard SD socket. A grip anchor pin is disposed inside the chamber to engage a grip notch disposed on the microSD card. A pre-molded switch slot is provided on the molded plastic casing, and an insert-in write protect switch is mounted after molding.

22 Claims, 19 Drawing Sheets

U.S. PATENT DOCUMENTS

| | | | |
|---|---|---|---|
| 6,000,006 A | 12/1999 | Bruce et al. | |
| 6,012,636 A | 1/2000 | Smith | |
| 6,040,622 A | 3/2000 | Wallace | |
| 6,044,428 A | 3/2000 | Rayabhari | |
| 6,069,920 A | 5/2000 | Schulz et al. | |
| 6,102,743 A | 8/2000 | Haffenden et al. | |
| 6,125,192 A | 9/2000 | Bjorn et al. | |
| 6,148,354 A | 11/2000 | Ban et al. | |
| 6,166,913 A | 12/2000 | Fun et al. | |
| 6,193,152 B1 | 2/2001 | Fernando et al. | |
| 6,231,363 B1 | 5/2001 | Kosmala | |
| 6,241,534 B1 | 6/2001 | Neer et al. | |
| D445,096 S | 7/2001 | Wallace | |
| 6,292,863 B1 | 9/2001 | Terasaki et al. | |
| 6,297,448 B1 | 10/2001 | Hara | |
| 6,313,400 B1 | 11/2001 | Mosquera et al. | |
| 6,321,478 B1 | 11/2001 | Klebes | |
| D452,690 S | 1/2002 | Wallace et al. | |
| D452,865 S | 1/2002 | Wallace et al. | |
| D453,934 S | 2/2002 | Wallace et al. | |
| 6,381,143 B1 | 4/2002 | Nakamura | |
| 6,399,906 B1 | 6/2002 | Sato et al. | |
| 6,410,355 B1 | 6/2002 | Wallace | |
| 6,438,638 B1 | 8/2002 | Jones et al. | |
| 6,444,501 B1 | 9/2002 | Bolken | |
| 6,462,273 B1 | 10/2002 | Corisis et al. | |
| 6,475,830 B1 | 11/2002 | Brillhart | |
| 6,490,163 B1 | 12/2002 | Pua et al. | |
| 6,527,188 B1 | 3/2003 | Shobara et al. | |
| 6,567,273 B1 | 5/2003 | Liu et al. | |
| 6,570,825 B2 | 5/2003 | Miranda et al. | |
| 6,580,615 B1 | 6/2003 | Nakanishi et al. | |
| 6,615,404 B1 | 9/2003 | Garfunkel et al. | |
| 6,618,243 B1 | 9/2003 | Tirosh | |
| 6,624,005 B1 | 9/2003 | DiCaprio et al. | |
| 6,634,561 B1 | 10/2003 | Wallace | |
| 6,671,808 B1 | 12/2003 | Abbott et al. | |
| 6,676,420 B1 | 1/2004 | Liu et al. | |
| 6,718,407 B2 | 4/2004 | Martwick | |
| 6,733,329 B2 | 5/2004 | Yang | |
| 6,740,964 B2 | 5/2004 | Sasaki | |
| 6,746,280 B1 * | 6/2004 | Lu et al. | 439/630 |
| 6,757,783 B2 | 6/2004 | Koh | |
| 6,763,410 B2 | 7/2004 | Yu | |
| 6,773,192 B1 | 8/2004 | Chao | |
| 6,778,401 B1 | 8/2004 | Yu et al. | |
| 6,832,281 B2 | 12/2004 | Jones et al. | |
| 6,854,984 B1 | 2/2005 | Lee et al. | |
| 6,900,988 B2 | 5/2005 | Yen | |
| 6,924,547 B2 | 8/2005 | Kanemoto et al. | |
| 6,932,629 B2 | 8/2005 | Ikenoue | |
| 6,940,153 B2 | 9/2005 | Spencer et al. | |
| 6,944,028 B1 | 9/2005 | Yu et al. | |
| 6,979,210 B2 | 12/2005 | Regen et al. | |
| 6,980,188 B1 | 12/2005 | Worley, III et al. | |
| 7,004,780 B1 | 2/2006 | Wang | |
| 7,009,847 B1 | 3/2006 | Wu et al. | |
| 7,011,247 B2 | 3/2006 | Drabczuk et al. | |
| 7,017,248 B2 | 3/2006 | Choi et al. | |
| 7,089,661 B2 | 8/2006 | Fong et al. | |
| 7,104,809 B1 | 9/2006 | Huang | |
| 7,153,148 B2 | 12/2006 | Chen et al. | |
| 7,210,967 B1 * | 5/2007 | Lee | 439/630 |
| 7,238,053 B1 * | 7/2007 | Liu et al. | 439/630 |
| 7,255,606 B2 * | 8/2007 | Tanaka et al. | 439/630 |
| 7,296,098 B2 | 11/2007 | Shih | |
| 7,314,388 B2 * | 1/2008 | Yamada et al. | 439/630 |
| 7,361,032 B2 | 4/2008 | Loftus | |
| 7,364,090 B2 | 4/2008 | Cuellar et al. | |
| 7,371,119 B1 * | 5/2008 | Lee | 439/630 |
| 7,416,419 B2 | 8/2008 | Collantes, Jr. et al. | |
| 7,416,451 B2 * | 8/2008 | Tanaka et al. | 439/630 |
| 7,422,454 B1 | 9/2008 | Tang et al. | |
| 7,425,157 B1 * | 9/2008 | Hung | 439/630 |
| 7,427,026 B2 * | 9/2008 | Kojima et al. | 235/441 |
| RE42,410 E * | 5/2011 | Yamada et al. | 439/630 |
| 2001/0038547 A1 | 11/2001 | Jigour et al. | |
| 2001/0043174 A1 | 11/2001 | Jacobsen et al. | |
| 2002/0036922 A1 | 3/2002 | Roohparvar | |
| 2002/0116668 A1 | 8/2002 | Chhor et al. | |
| 2002/0166023 A1 | 11/2002 | Nolan et al. | |
| 2002/0186549 A1 | 12/2002 | Bolken | |
| 2003/0038043 A1 | 2/2003 | Painsith | |
| 2003/0046510 A1 | 3/2003 | North | |
| 2003/0100203 A1 | 5/2003 | Yen | |
| 2003/0163656 A1 | 8/2003 | Ganton | |
| 2003/0177300 A1 | 9/2003 | Lee et al. | |
| 2003/0182528 A1 | 9/2003 | Ajiro | |
| 2003/0223286 A1 | 12/2003 | Lee | |
| 2004/0034765 A1 | 2/2004 | O'Connell | |
| 2004/0066693 A1 | 4/2004 | Osako et al. | |
| 2004/0087213 A1 | 5/2004 | Kao | |
| 2004/0137664 A1 | 7/2004 | Elazar et al. | |
| 2004/0143716 A1 | 7/2004 | Hong | |
| 2004/0145875 A1 | 7/2004 | Yu et al. | |
| 2004/0148482 A1 | 7/2004 | Grundy et al. | |
| 2004/0153595 A1 | 8/2004 | Sukegawa et al. | |
| 2004/0255054 A1 | 12/2004 | Pua et al. | |
| 2005/0009388 A1 | 1/2005 | Chao | |
| 2005/0114587 A1 | 5/2005 | Chou et al. | |
| 2005/0182858 A1 | 8/2005 | Lo et al. | |
| 2005/0193161 A1 | 9/2005 | Lee et al. | |
| 2005/0193162 A1 | 9/2005 | Chou et al. | |
| 2005/0216624 A1 | 9/2005 | Deng et al. | |
| 2005/0218200 A1 | 10/2005 | Focke et al. | |
| 2005/0248926 A1 | 11/2005 | Asom et al. | |
| 2006/0075395 A1 | 4/2006 | Lee et al. | |
| 2008/0093720 A1 | 4/2008 | Hiew et al. | |
| 2008/0094807 A1 | 4/2008 | Hiew et al. | |

OTHER PUBLICATIONS

USB FlashCard "Main Body Dimensions", "Top View", "Bottom View" Web pages, Lexar, 2004, 3 pages.

* cited by examiner

MICRO-SD TO SECURE DIGITAL ADAPTOR CARD AND MANUFACTURING METHOD

RELATED APPLICATIONS

This application is a continuation-in-part (CIP) of U.S. patent application for "Molding Methods To Manufacture Single-Chip Chip-On-Board USB Device", U.S. application Ser. No. 11/773,830, filed Jul. 5, 2007.

This application is a continuation-in-part (CIP) of U.S. patent application for "Manufacturing Process for Single-Chip MMC/SD Flash Memory Device with Molded Asymmetric Circuit Board", U.S. application Ser. No. 11/831,888, filed Jul. 31, 2007.

This application is also a CIP of U.S. patent application for "Direct Package Mold Process for Single Chip SD Flash Cards", U.S. application Ser. No. 12/175,753, filed Jul. 18, 2008.

FIELD OF THE INVENTION

This invention relates to adaptor cards for allowing smaller memory cards to communicate with a host system through a socket built for a larger memory card, and even more particularly to an improved manufacturing process for producing microSD-to-SD adaptor cards and to the improved microSD-to-SD adaptor cards built using this method.

BACKGROUND OF THE INVENTION

A memory card adaptor (adaptor card) is a device that includes a adaptor body having outer dimensions and contact pads that are identical with those of a relatively large "host" memory card, and a passive connection structure for electrically connecting the contact pads of a smaller memory card with the "host" contact pads of the adaptor card, thereby facilitating possible communications between the smaller memory card and a host system by way of a socket build for the larger "host" memory card.

A conventional adaptor card manufacturing process involves mounting a lead frame connector between top and bottom housing portions that are then fused, e.g., by ultrasonic welding. The lead frame connector has one end adapted to the desire pin counts and dimensions of the smaller memory card device (e.g., a microSD card or miniSD card), and the other output end includes contact pads and dimensions associated with the larger "host" memory card (e.g., a Secure Digital (SD) card). An optional switch button and optional notch retaining pin are separately placed between the top and bottom housing pieces, and then ultrasonic welding is then used to fuse the two housing pieces together, thereby securing the switch button and notch retaining pin into respective slots and completing the adaptor card.

The conventional adaptor card production method produces adaptor cards that are not reliable when subjected to rough handling and shock impact, such as when they are accidentally stepped on or dropped from a high point. The low quality assembled housing pieces are often delaminated along the ultrasonic weld seam by such rough handling, and sometimes the side surface of the housing structure can become cracked.

What is needed is a method for producing an adaptor card (e.g., a microSD-to-SD adaptor card) that avoids the problems described above. What is also needed is a reliable and robust microSD-to-SD adaptor card produced by this method.

SUMMARY OF THE INVENTION

The present invention is directed to a method for manufacturing an improved microSD-to-SD adaptor card using a single path mold method that provides a more cost effective and reliable way of producing consistent quality adaptor cards in comparison to conventional adaptor manufacturing methods that use a two piece pre-molded casing that is ultrasonically welded together to form the adaptor housing. The single path mold method provides a tough housing structure that has higher resistance to impact force or shock impact without cracking or delaminating along ultrasonic weld interfaced junctions, as is characteristic of conventional methods. The single path mold method also provides a lower cost and higher assembly throughput than conventional methods by eliminating the ultrasonic weld process, thereby reducing manpower and equipment overhead.

According to an embodiment of the present invention, a microSD-to-SD adaptor card includes a base substrate forming a lower wall of the adaptor card, a lead frame structure fixedly connected to the inside surface of the substrate, a protective cap mounted on the substrate and forming a chamber enclosing eight microSD contact pins of the lead frame, and a plastic casing that is formed by a thermoset plastic molding process over the protective cap and exposed portions of the base. Because the base substrate is formed with standard SD width and length dimensions, inexpensive fabrication of a substantially completed adaptor card is facilitated by molding the plastic casing such that it includes an upper wall that defines openings to expose nine standard SD contact pads and a standard SD thickness. The nine standard SD contact pads are electrically connected to the eight microSD contact pins by connector wires that are covered by the upper wall of the integral molded plastic casing. The thermoset plastic of the plastic casing also secures the protective cap to the base substrate, thus providing a rigid structure that prevents delamination. In one embodiment, both the protective cap and the plastic casing are formed from the same thermoset plastic, causing the cap to slightly soften when the casing is formed, thereby providing a nearly ideal cross-linking boundary between the protective cap and the casing without deformation. A rear opening is cut or otherwise provided on the rear edge of the integral molded plastic casing to facilitate insertion of a standard microSD card. The eight microSD contact pins are disposed inside the chamber such that, when the microSD card is fully inserted through the rear opening into the chamber, the eight contact pads on the microSD card are contacted by the eight microSD contact pins, whereby electrical signals generated by the microSD card on any of the eight contact pads are transmitted corresponding ones of the nine SD contact pads for transmission to the host system by way of a standard SD socket. In one embodiment, the lead frame includes a grip anchor pin that is supported parallel to the eight microSD contact pins, is disposed inside the chamber such that, when the microSD card is fully inserted through the rear opening, the grip anchor pin engages a grip notch disposed on a side edge of the microSD card such that the microSD card is secured inside the chamber. In one embodiment, the molded plastic casing further includes ribs that are formed between the openings through which the nine standard SD contact pads are exposed.

According to an alternative embodiment of the present invention, high quality microSD-to-SD adaptor cards utilize the one-shot molding process to provide a pre-molded switch slot on the side and lower wall of the molded plastic casing, and the present invention introduces an insert-in write protect switch mounting process that facilitates low-cost assembly of a write protect switch assembly on the adaptor card. The pre-molded switch slot includes a cavity that is exposed by a side (first) opening and a bottom (second) opening that are defined in the molded plastic casing. The write protect switch assembly includes a movable switch button and a switch cap that are separately molded and separately attached to the molded plastic casing. The movable switch button is mounted first, and includes a base portion that is movably engaged in the cavity of the pre-molded switch slot, and a button top extending through the side opening. The switch cap is then secured over bottom opening such that a flat wall portion of the switch cap covers the base portion of the movable switch button. This feature provides an advantage over conventional techniques in that attaching the write protect switch assembly to the molded casing (i.e., instead of to the substrate prior to thermoset molding) with the switch button encapsulated in between two molded pieces (i.e., a portion of the molded casing and the flat wall of the switch cap) provides a sturdy and reliable protective structure that resists undesirable detachment of the movable switch button during use.

In accordance with another embodiment of the present invention, a method for producing microSD-to-SD adaptor cards includes forming a panel (assembly) including multiple substrate regions arranged in rows and columns, and lead frame structures fixedly connected (e.g., embedded) onto the inside surface of each substrate region, mounting a protective cap on the inside surface of each substrate region such that the cap forms an chamber enclosing eight microSD contact pins and a grip anchor pin of each lead frame structure, and molding thermoset plastic on the inside surface of each substrate region, each protective cap, and at least a portion of each lead frame structure to form multiple integral molded plastic casings having substantially the packages shape and dimensions of standard SD devices. Note that the protective cap prevents formation of said thermoset plastic in the chamber enclosing the eight microSD contact pins and the grip anchor pin, thereby greatly simplifying the manufacturing process. Each substrate region has a card body corner and standard notch features characteristic of standard SD cards that are punched out or molded during a panel fabrication process. After securing the lead frame structures and protective caps, the substrate panel is then mounted inside a molding cavity, and a thermal plastic material is injected to form the molded casing. Standard features of the final SD form factor, such as notches, corners and ribs, are defined on one or both of the upper and lower molding plates (dies) to facilitate forming the molded casing as an integral molded plastic structure casing over each substrate region. Singulation is then performed to separate the individual cards from, e.g., the peripheral panel support structure and adjacent cards using a saw machine or other cutting device. This singulation process is utilized to open a slot through the rear wall of each card for insertion of microSD cards. Note that the molded casing, the protective cap and the substrate material are cut during the same cutting process, whereby rear wall of the adaptor card is defined with the slot formed therein. This method facilitates the production of adaptor cards at a lower cost and higher assembly throughput than that achieved using conventional production methods. In one embodiment, the mold defines a space for the write protect switch, and an assembly process is performed after singulation is completed.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in manufacturing methods for microSD-to-SD adaptor cards, and to the improved microSD-to-SD adaptor cards made by these methods. The following description is presented to enable one of ordinary skill in the art to make and use the invention as provided in the context of a particular application and its requirements. As used herein, the terms "upper", "upwards", "lower", "top", "bottom", "front", "rear", "side" and "downward" are intended to provide relative positions for purposes of description, and are not intended to designate an absolute frame of reference. Further, the term "microSD" is used generically herein to refer to any memory card devices that can be inserted within a standard Secure Digital (SD) 2.0 or 3.0 devices, including devices meeting the microSD specifications described under the SD standard. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
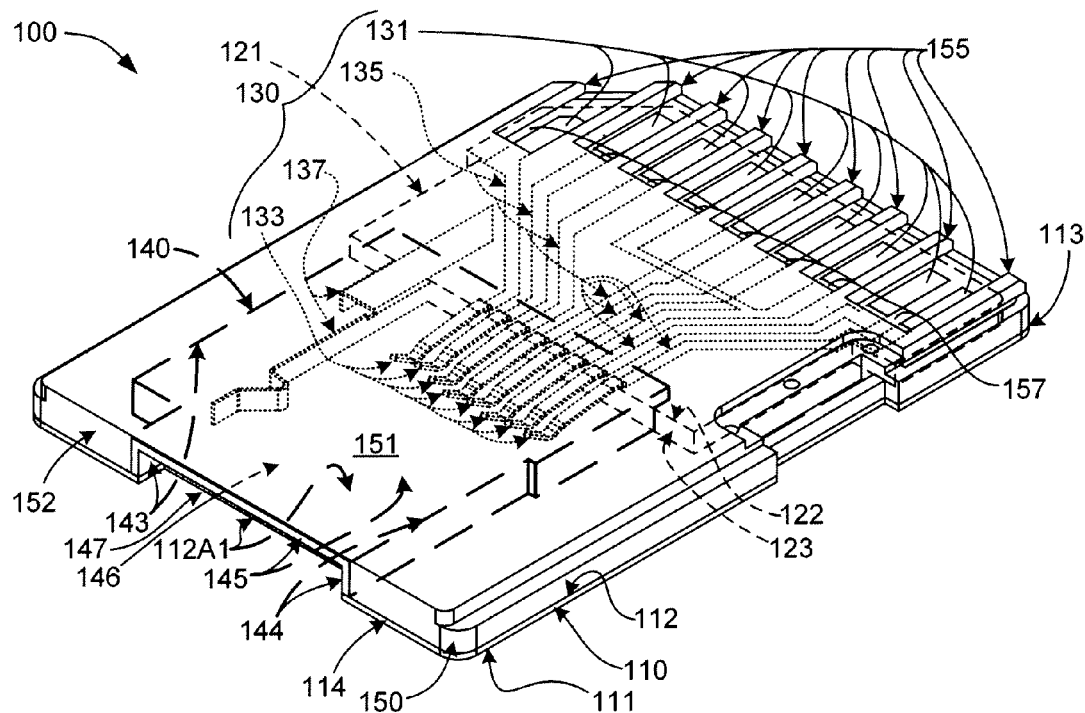
FIGS. 1(A) and 1(B) are exploded top and assembled bottom perspective views, respectively, showing an exemplary microSD-to-SD adaptor card according to an embodiment of the present invention.
Figure 1B:
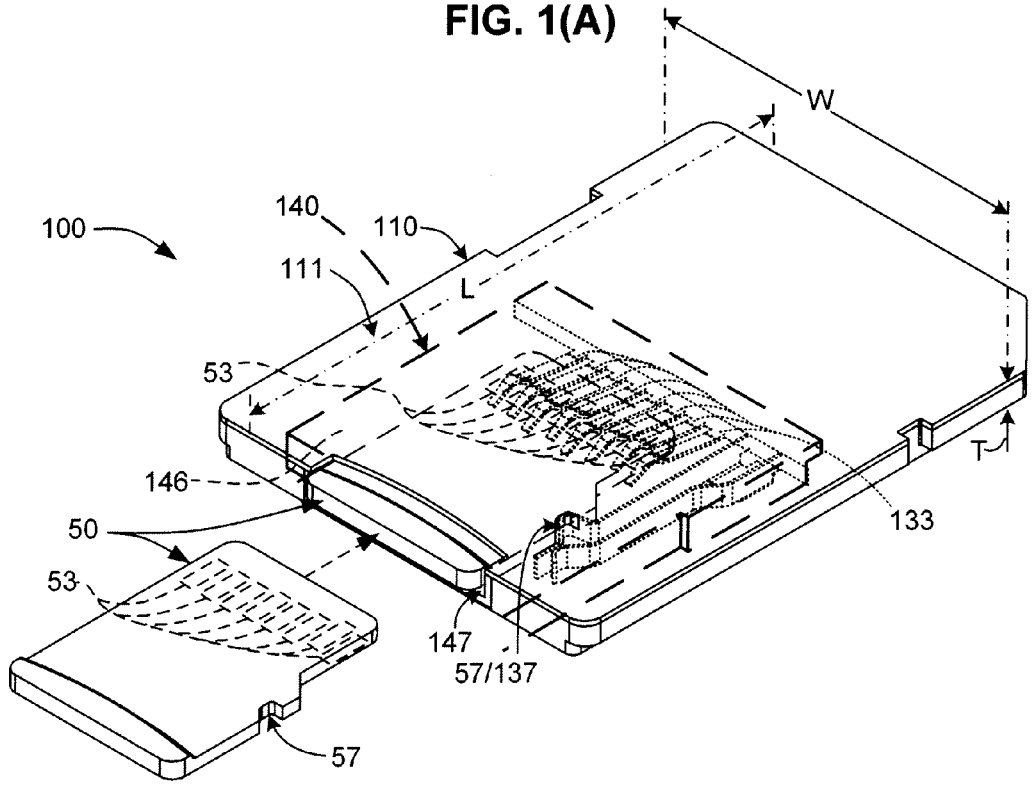

FIGS. 1(A) and 1(B) are exploded top and assembled bottom perspective views, respectively, showing an exemplary microSD-to-SD adaptor card 100 according to a first embodiment of the present invention. Adaptor card 100 generally includes a substrate 110, a lead frame structure 130, a protective cap 140, and an integral molded plastic casing 150 that is integrally molded over substrate 110, lead frame structure 130 and protective cap 140 in the manner set forth below. As used herein, the terms "integral" and "integrally molded" are used to characterize plastic molded casing 150 as a single-piece plastic structure simultaneously formed by applying molten thermoset plastic (e.g., using injection or transfer molding techniques) over exposed surface portions of substrate 110, portions of lead frame structure 130 that are described below, and protective cap 140 (i.e., as opposed to pre-molded structures that are separately mounted onto substrate 110).

Referring to FIG. 1(A), substrate 110 is a flat plastic structure that forms a lower wall of adaptor card 100, and includes a planar lower (outside) surface 111, an opposing Upper (inside) surface 112, a front edge 113, and an opposing rear edge 114. According to an aspect of the invention, a peripheral edge of substrate 110 (i.e., front edge 113, rear edge 114, and side edges extending therebetween) are shaped and arranged in accordance with the footprint of an SD card as set forth by established SD specifications.

Lead frame structure 130 is fixedly connected to the inside surface 112 of substrate 110, e.g., by way of a plastic block 121 (described further below). Lead frame structure includes nine SD contact pads 131, eight microSD contact pins 133, and multiple connector wires 135 respectively electrically connecting each microSD contact pins 133 to an associated SD contact pad 131. SD contact pads 131 are disposed adjacent to front edge 113 of substrate 110, and having respective contact surfaces facing away from substrate 110 and arranged in a standard SD pattern. MicroSD contact pins 133 are simply supported by block 121 such that they extend over inside surface 112 of substrate 110 toward rear edge 114 of substrate 110. Lead frame structure 130 also includes an optional grip anchor pin 137 that is supported by block 121 over the inside surface 112 of substrate 110, and also extends toward the rear edge 114 parallel to but spaced from microSD contact pins 133.

Protective cap 140 is mounted on inside surface 112 of substrate 110, and includes opposing side walls 143 and 144 extending upward from inside surface 112, and an upper wall 145 that is supported by side walls 143 and 144 and disposed parallel to and spaced from a portion 112A of inside surface 112, whereby side walls 143,144, upper wall 145 and inside surface portion 112A define a chamber 146 that encloses microSD contact pins 133 and grip anchor pin 137. According to an aspect of the invention, protective cap 140 is a pre-molded structure that consists essentially of a material (e.g., thermoset plastic, ceramic or metal) having a (first) melting point temperature that is higher than that of the thermoset plastic used to form plastic casing 150 for reasons that will become clear below.

As mentioned above, integral molded plastic casing 150 consisting essentially of a thermoset plastic having a (second) melting point temperature below that of protective cap 140, and generally provides an upper wall 151 that is formed on exposed portions of inside surface 112, and over the upper wall 145 of protective cap 140 such that protective cap 140 is secured to substrate 110 by the thermoset plastic making up plastic casing 150. Upper wall 151 defines multiple openings 157 disposed near front edge 113 that are shaped and arranged such that each of the nine SD contact pads 131 is exposed through an associated opening 157. Plastic casing 150 also includes ribs 155 that are disposed as indicated between corresponding adjacent pairs of openings 157. Both openings 157 and ribs 155 are shaped and formed according to established SD standards. Plastic casing 150 also includes a rear edge 152 extending upward from rear edge 114.

According to an embodiment of the present invention, both the pre-molded protective cap 140 and the plastic casing 150 are formed from the same thermoset plastic. By forming/cooling the protective cap 140 prior to the case forming process, the glass transition temperature (Tg), which is the melting point temperature of the thermoset plastic forming protective cap 140, is shifted 5° C. to 10° C. higher than the "virgin" Tg of the thermoset plastic (i.e., the melting point temperature of the thermoset plastic when it is melted for the first time). Therefore, when thermoset plastic heated to the "virgin" Tg is subsequently molded over the protective cap 140 to form plastic casing 150, protective cap 140 slightly softens due to the heat of the molten thermoset plastic. This arrangement provides a close to perfect type of cross-linking boundary between protective cap 140 and plastic casing 150 without causing deformation of protective cap 140.

According to an aspect of the present invention, the molding process utilized to form integral plastic molded casing 150 facilitates forming adaptor cards having different lead frames 130 and protective caps 140 without requiring changes to the molding dies. For example, as indicated in FIG. 1(B), molded casing 150 has an overall thickness T that is set by SD standards at 2.1 mm thick, of which upper wall 151 requires a minimum thickness S1 of 0.7 mm in order to form ribs 155 according to SD standards. By forming integral plastic molded casing 150 in a single-shot molding process, the plastic material forming upper wall 151 entirely encases (encapsulates) upper surface 112, lead frame 130 and protective cap 140 (except as mentioned herein). As used herein, the terms "encase" and "encapsulate" and their derivatives are used to describe the relationship between plastic molded casing 150 and surface 112, lead frame 130 and protective cap 140, whereby substantially all exposed surface areas of these structures are contacted by plastic material that is applied in a molten form and then sets (hardens) in a shape determined by the external surfaces of structures and associated connections (e.g., connector wires 135), thereby at least securing protective cap 140 to upper surface 112. In contrast, components enclosed by a pre-molded housing are not "encased" in that the shape of the pre-molded housing is not determined by the external surfaces of components and associated connections.

According to another aspect of the present invention, rear edge 152 of plastic casing 150 defines a rear opening 147 that communicates with chamber 146, and is shaped and arranged to facilitate the insertion of a microSD card 50 into chamber 146. Further, the eight microSD contact pins 133 are disposed inside chamber 146 such that, when microSD card 50 is fully inserted through the rear opening 147 into the chamber 146 (as indicated by dashed lines in FIG. 1(B)), the eight contact pads 53 on the microSD card 50 are operably respectively contacted by (connected to) the eight microSD contact pins 133, whereby electrical signals generated by microSD card 50 on any of the eight contact pads 53 are transmitted corresponding ones of the nine SD contact pads 131. In addition, grip anchor pin 137 is disposed inside chamber 146 such that, when the microSD card 50 is fully inserted through the rear opening 147 into chamber 146, grip anchor pin 137 engages a grip notch 57 disposed on a side edge of microSD card 50, whereby microSD card 50 is removably secured inside chamber 146 and in operably contact with microSD contact pins 133. In this way, when adaptor card 110 is subsequently inserted into a standard SD socket (not shown), microSD card 50 is able to communicate with the host system to which the socket is connected by way of electrical signals generated on any of the eight contact pads 53, which are transmitted to corresponding SD contact pads 131 by way of microSD contact pins 133 and connector wires 135.

Figure 2:
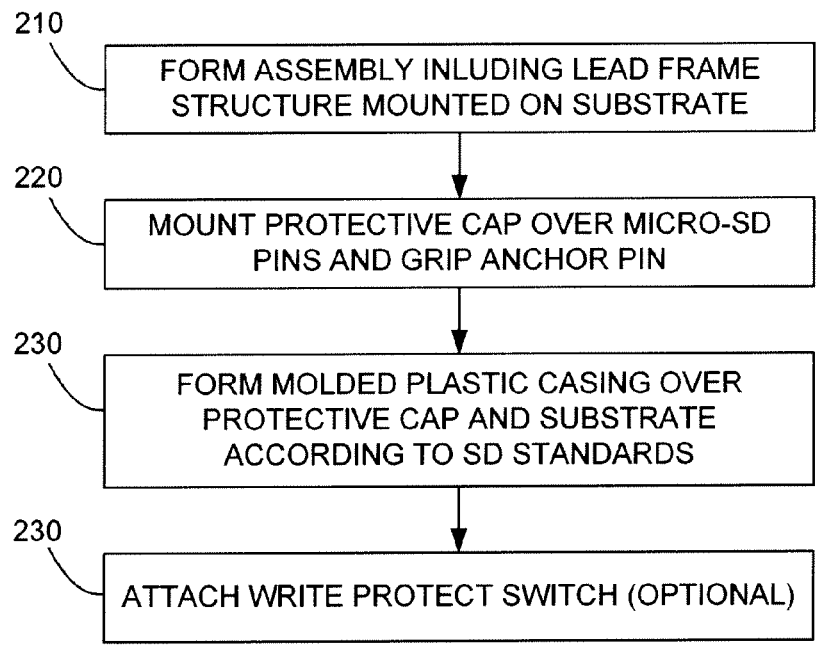
FIG. 2 is a flow diagram showing a simplified manufacturing process for producing the adaptor card of FIG. 1(A) according to another embodiment of the present invention.
Figure 3A:
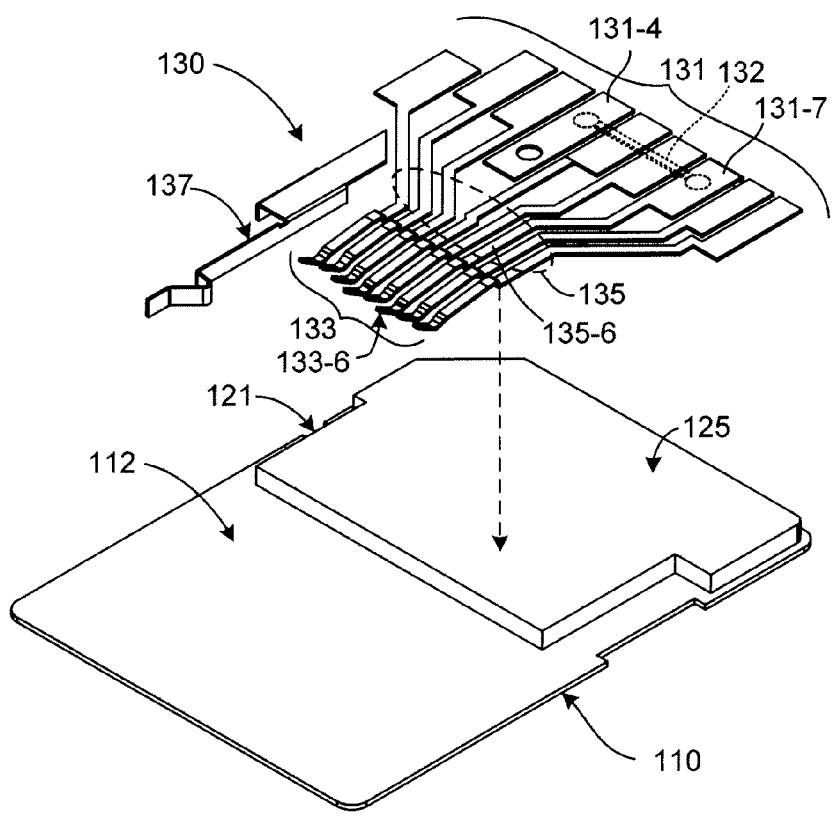
FIGS. 3(A), 3(B) and 3(C) are exploded top perspective views showing the microSD-to-SD adaptor card of FIG. 1 during selected stages of the simplified manufacturing process shown in FIG. 2.
Figure 3B:
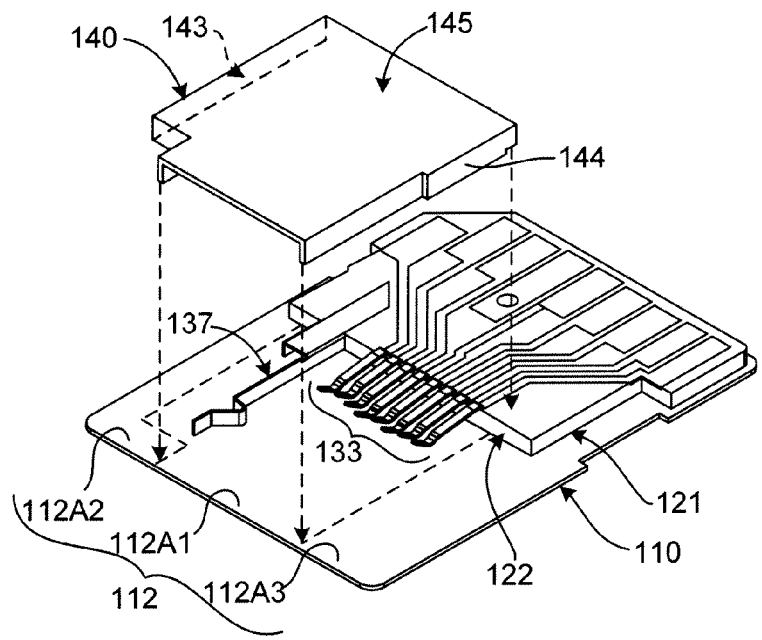
Figure 3C:
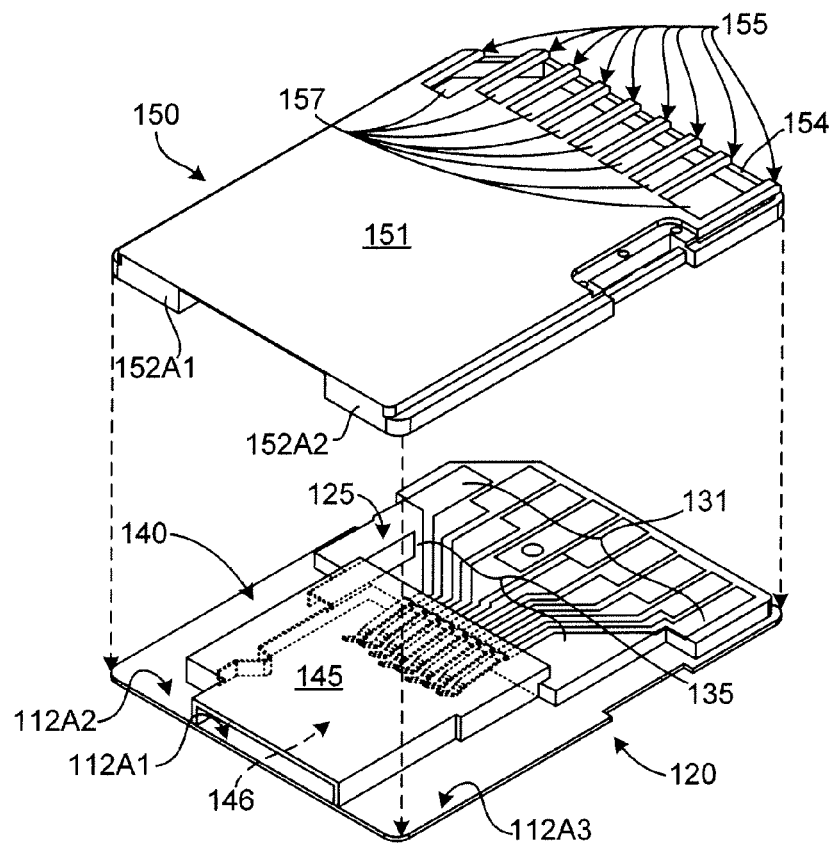

FIG. 2 is a flow diagram showing a simplified manufacturing process for producing the adaptor card of FIG. 1(A) according to an embodiment of the present invention, and FIGS. 3(A) to 3(C) are perspective views illustrating the first three processes of the flow diagram shown in FIG. 2.

Referring to the top of FIG. 2 and to FIG. 3(*a*), block 210 includes forming an assembly including substrate 110 and lead frame structure 130, both described above. As generally depicted in FIG. 3(A), this process involves embedding lead frame structure 130 into a plastic block 121 (or other structure) that is secured to or integrally formed on inside surface 112 of substrate 110. Note that lead frame structure 130 includes individual conductive paths formed between each SD contact pad 131 and an associated microSD contact pin 133 by way of an associated conductor 135. Note that SD contact pads 131-4 and 131-7 are shorted together using a stamped metal shorting bar 132, which is disposed at the tip of one of one of pads 131-4 and 131-7. During processing metal shorting bar 132 is cut and then bent over onto the surface of the associated pad such metal lead contacts contact pads 131-4 and 131-7 at its two ends, and indicated by dashed lines in FIG. 3(A). Pads 131-4 and 131-7 serve as standard ground pins on an SD memory card, and therefore make contact with ground terminals in a standard SD socket. Due to the presence of shorting bar 132, both pads 131-4 and 131-7 are electrically connected to microSD contact pin 133-6 by way of associated conductor 135-6. Metal shorting bar 132 is required because microSD device 50 has only one ground pin that contacts microSD contact pin 133-6. Finally, lead frame structure 130 includes a grip anchor pin 137 is embedded in block 121 in the manner described above such that, as shown in FIG. 3(A), is electrically isolated from microSD contact pins 133. A completed assembly 120, which includes lead frame structure 130, plastic block 121, and substrate 110, is shown in FIG. 3(B).

Referring to block 220 of FIG. 2 and to FIG. 3(B), protective cap 140 is then mounted on inside surface 112 of substrate 110 such that opposing side walls 143 and 144 and upper wall 145 form an chamber 146 that encloses microSD contact pins 133 and grip anchor pin. In particular, as indicated in FIG. 3(B), protective cap 140 is mounted on inside surface 112 such that side walls 143 and 144 abut the dotted lines and a rear portion of protective cap 140 abuts a front face 122 of block 121, thereby enclosing region 121A1, microSD contact pins 133 and grip anchor pin 137. Note that surface regions 112A2 and 112A3, disposed on opposite sides of region 112A1, remain exposed after protective cap 140 is mounted (i.e., as shown in FIG. 3(C)).

Referring to block 230 of FIG. 2 and to FIG. 3(C), thermoset plastic is then molded to form upper wall 151 on exposed inside surface portions 112A2 and 112A3 of substrate 110, on protective cap 140, and over at least a portion of lead frame structure 130 (e.g., over conductors 135, which are neither enclosed by protective cap 140 like microSD contact pins 133, nor otherwise protected from overmolding by the molding die like SD contact pads 131), thereby forming integral molded plastic casing 150. As described above, plastic casing 150 is arranged such that protective cap 140 is secured to substrate 110 by the thermoset plastic forming casing 150, and SD contact pads 131 are exposed through openings 157 defined between ribs 155. Note that protective cap 140 is disposed in the molding die such that it prevents the thermoset plastic from entering chamber 146 and/or depositing on microSD contact pins 133 and the grip anchor pin 137, thereby facilitating proper operation of adaptor card 100. That is, as indicated on the rear end of plastic casing 150, the assembly is mounted in the molding die such that rear edge portions 152A1 and 152A2 are formed along the opposing side walls of protective cap 140 and extend from substrate surface portions 112A2 and 112A3 to upper wall 151, but the thermoset material is prevented from entering chamber 146.

Referring again to FIG. 2, an optional embodiment of the present invention includes, after forming the molded plastic casing, attaching a write protect switch to the casing (block 240) utilizing the novel structure and process described below with reference to FIG. 4.

Figure 4:
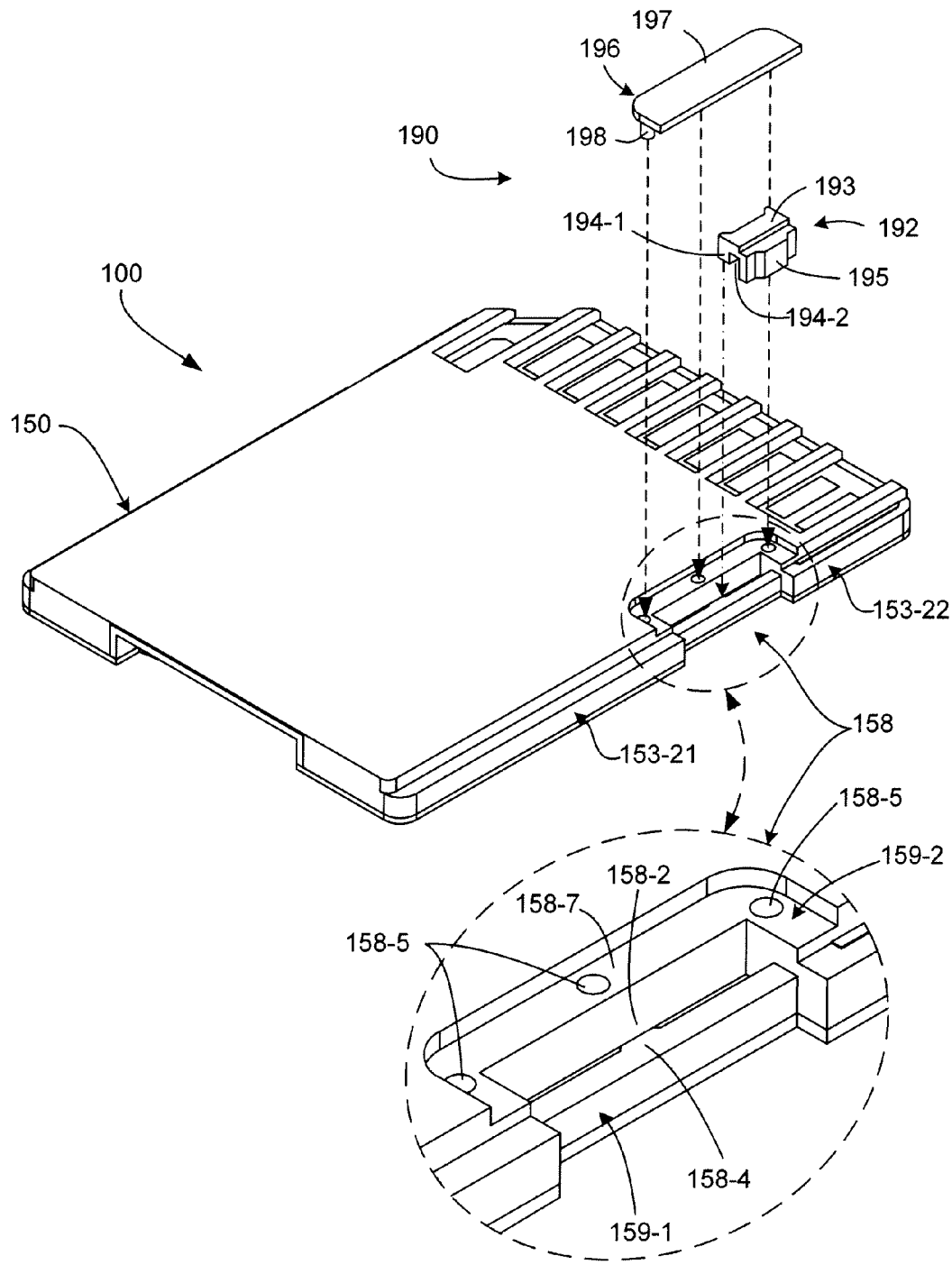
FIG. 4 is an exploded top perspective view showing the microSD-to-SD adaptor card of FIG. 1 including an insert-in write protect switch assembly according to an alternative embodiment of the present invention.

FIG. 4 is an exploded top perspective view showing adaptor card 100 and an insert-in write protect switch assembly 190 formed in accordance with an alternative specific embodiment of the present invention. According to an optional embodiment of the present invention, plastic molded casing 150 also defines a pre-molded switch slot 158 disposed between side wall sections 153-21 and 153-22, write protect switch assembly 190 includes a switch button 192 and a switch cap 196 that are secured to casing 150 over pre-molded switch slot 158 using a low-cost insert-in assembly process such that switch button 192 is movably secured to the switch slot and is partially exposed between side wall sections 153-21 and 153-22 for manipulation by a user.

Referring to the upper portion of FIG. 4, in the disclosed embodiment, switch button 192 includes a base portion 193 that defines a slide bar 194-1 and a button top 195 that define a retaining slot 194-2 therebetween. Switch cap 196 includes a flat wall portion 197, and three poles (protrusions) 198 extending downward from a lower surface of flat wall portion 197. Referring to the lower portion of FIG. 4, pre-molded switch slot 158 includes an elongated cavity 158-2 that is defined in casing 150 and is exposed by a first opening 159-1 defined between side wall portions 153-21 and 153-22 of side wall 153-2, and by a second opening 159-2 defined in a portion of lower wall 152. Pre-molded switch slot 158 includes several structures that are formed to accommodate mounting of write protect switch assembly 190 using a low-cost insert-in assembly process. In particular, pre-molded switch slot 158 includes a low retention wall 158-4 disposed between side wall portions 153-21 and 153-22, a support shelf 158-7 disposed around an inside edge of elongated cavity 158-2, and three retention holes (openings) 158-8 that extend downward into support shelf 158-7. The purposes of the other features are described below.

Figure 5A:
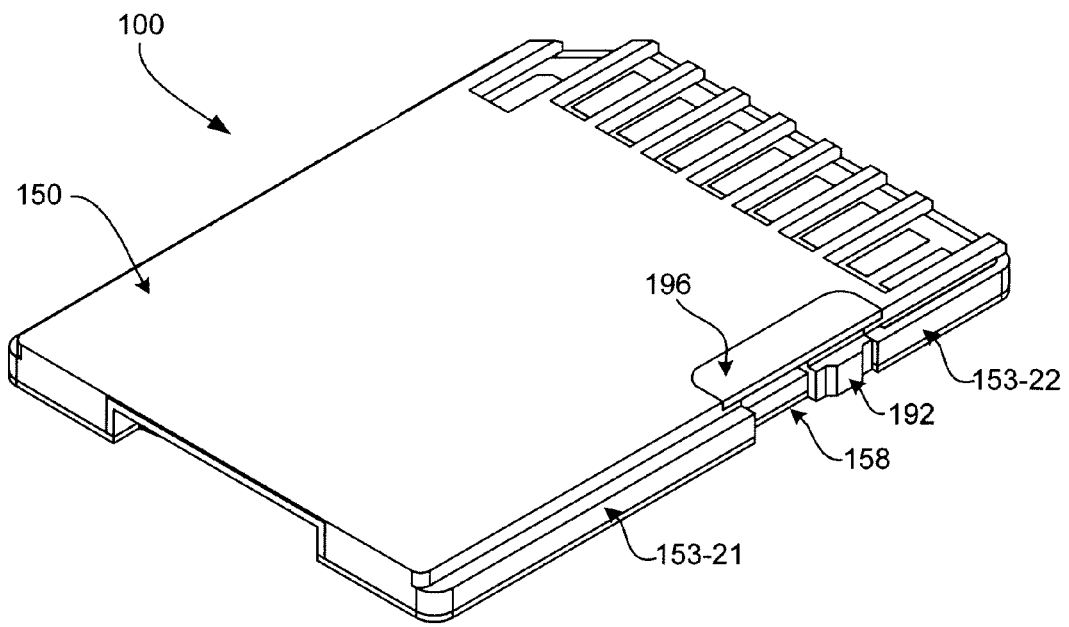
FIGS. 5(A) and 5(B) are top perspective views showing the exemplary microSD-to-SD adaptor card of FIG. 4 with the write protect switch assembly in alternative switch positions.
Figure 5B:
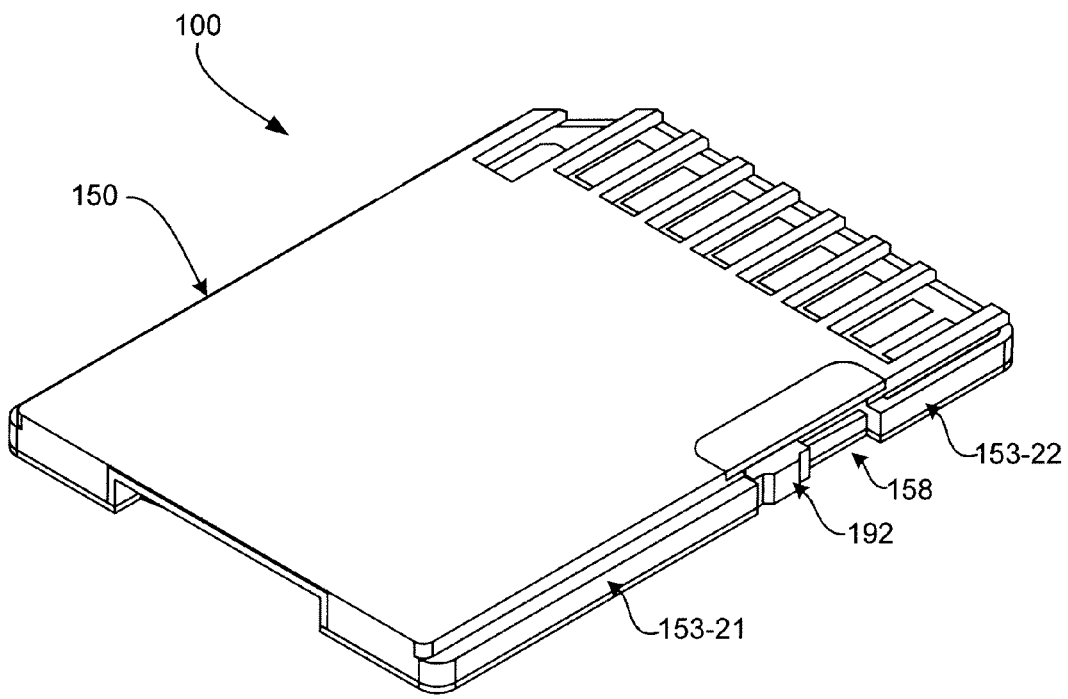

The low-cost insert-in assembly process for mounting write protect switch assembly 190 onto housing 150 is performed as follows. First, as indicated by the vertical dash-dot-line arrows, switch button 192 is mounted onto casing 150 such that retention wall 158-4 is slidably received inside slot 194-2 (i.e., such that slide bar 194-1 of base portion 193 is received inside elongated cavity 158-2, and button top 195 faces away from casing 150). Next, switch cap 196 is mounted onto casing 150 by inserting poles 198 into retention openings 158-8 and securing poles 198, e.g., using an adhesive. Switch cap 196 is mounted such that flat wall portion 197 is supported on support shelf 158-7 and encloses second opening 159-2 such that base portion 193 is covered by the flat wall portion 197 (e.g., as shown in FIG. 19(A)). Note that securing switch cap 196 in this manner does not impede sliding movement of switch button 192 along cavity 158-2, but prevents switch button 192 from being inadvertently pulled out of cavity 158-2. FIGS. 5(A) and 5(B) show SD device 100 after the insert-in assembly process is completed, with switch button 192 secured by switch cap 196 such that it slides relative to casing 150 between side wall portions 153-21 and 153-22, as indicated in these figures.

Figure 6:
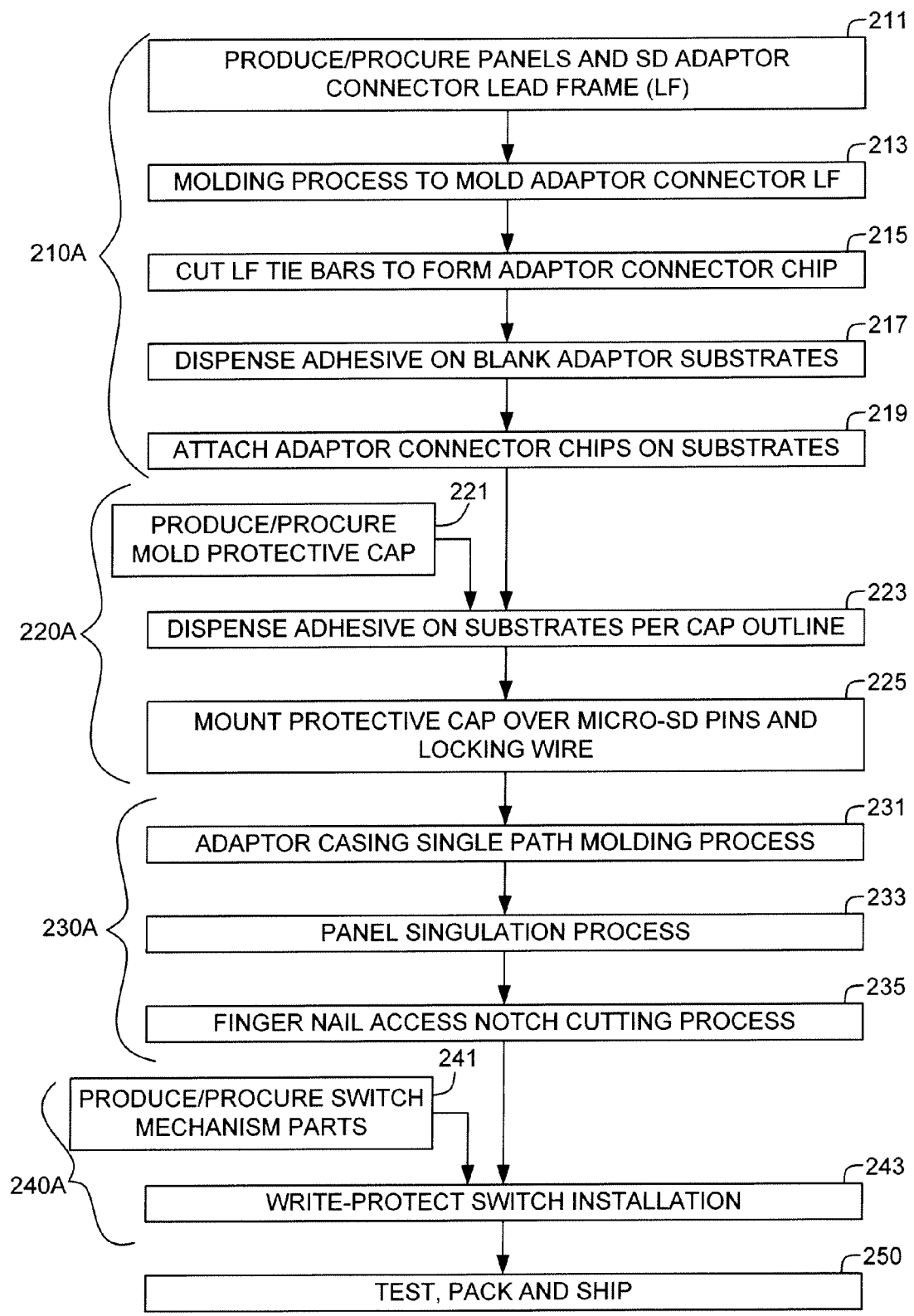
FIG. 6 is a flow diagram showing a manufacturing process for producing the adaptor card of FIG. 1(A) according to another embodiment of the present invention.

FIG. 6 is a flow diagram showing a method for producing adaptor cards (e.g., microSD-to-SD adaptor card 100) according to a specific embodiment of the present invention. The method set forth in FIG. 6 is categorized into four groups of sub-processes that generally follow the steps of the basic method provided in FIG. 2 (described above). In particular, a first group of sub-processes 210A associated with forming the lead frame/substrate assembly includes producing/procuring a substrate panel and microSD-to-SD adaptor connector lead frame (block 211), molding the lead frame into a plastic block (block 213), cutting tie bars from the lead frame to form an adaptor connector chip (block 215), dispensing an adhesive on the substrate panel (block 217), and then attaching the adaptor connector chips onto each substrate of the panel (block 219). A second group of sub-processes 220A associated with mounting the protective cap includes producing/procuring the caps (block 221), dispensing an adhesive on the substrate panel (block 223), and then attaching the protective caps to each substrate of the panel (block 225). A third group of sub-processes 230A associated with forming the plastic casing includes performing the thermoset molding process (block 231), cutting the panel into separate cards (block 233), and then cutting fingernail access notches into each card (block 235). An optional fourth group of sub-processes 240A associated with attaching a write protect switch, and include producing/procuring the write protect switch components (block 241) and then mounting the components onto each adaptor card (block 243). An additional process involving test, pack and ship (block 250) is also included.

The flow diagram of FIG. 6 will now be described in additional detail below with reference to FIGS. 7(A) to 15(B).

Figure 7A:
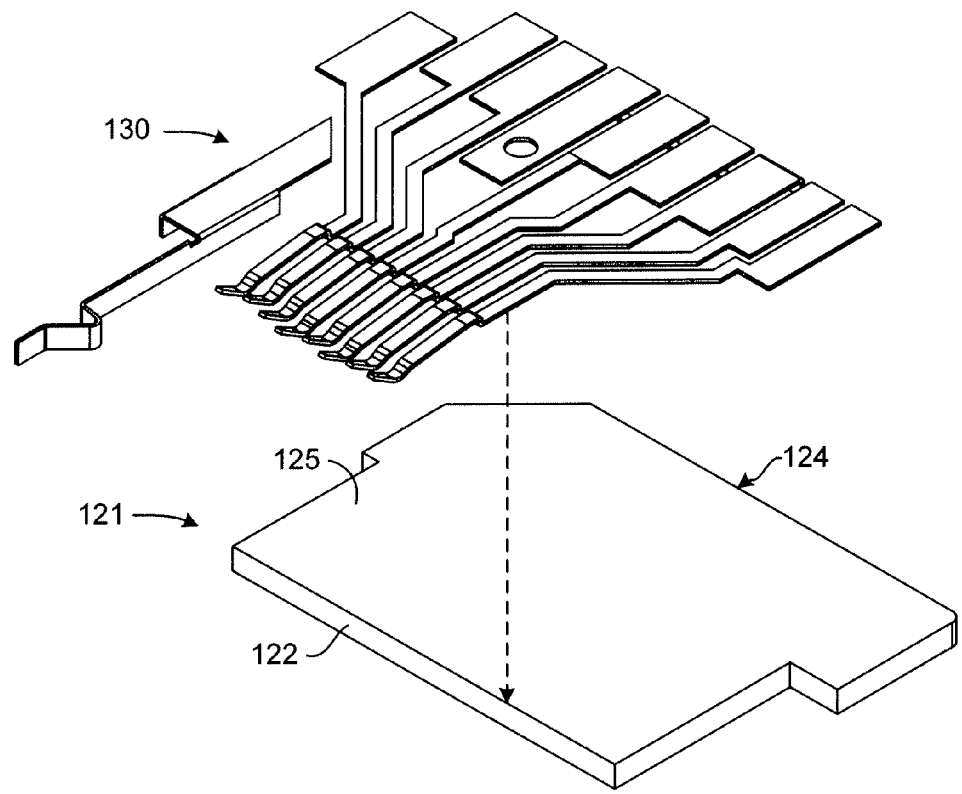
FIGS. 7(A) and 7(B) are exploded top and assembled top perspective views, respectively, showing a lead frame structure assembly according to the method of FIG. 6.
Figure 7B:
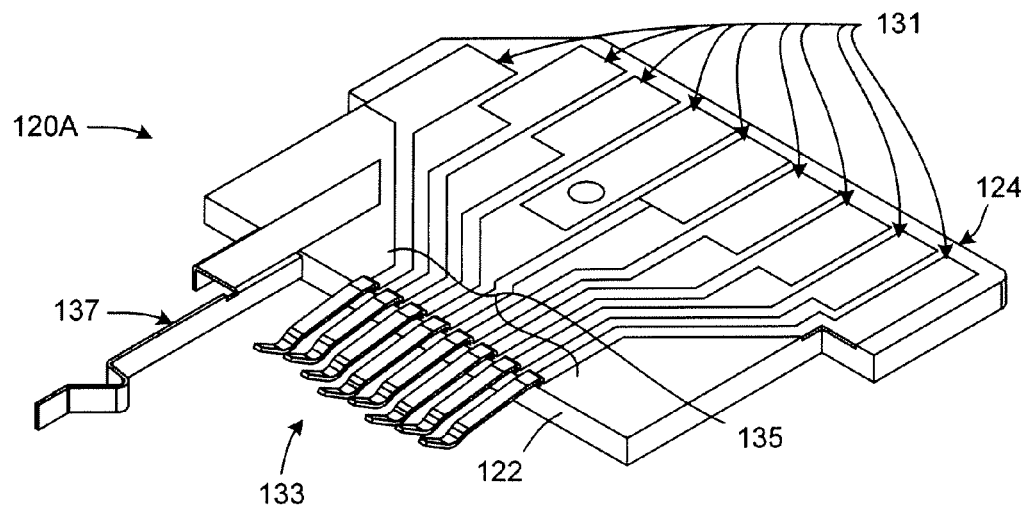

FIGS. 7(A) and 7(B) illustrate lead frame structure 130 before and after being subjected to a molding process in which lead frame is imbedded in upper surface 125 of plastic block 121 to form a connector chip block 120A, in which microSD contact pins 133 and grip anchor pin 137 extend from rear edge 122 of plastic block 121, SD contact pads 131 are aligned along a front edge 124 of plastic block 121, and connector wires 135 extend along upper surface 125 between microSD contact pins 133 and SD contact pads 131. Tie bars (not shown) surround and hold the various parts of lead frame structure 130, which are cut off after the mold process is completed. The purposes of the molding process are: first, to connect the multiple separate pins in a single plastic block before the tie bars that are attached to the metal frame are shear off, and second, to provide a structure that maintains SD contact pads 131 and microSD connector pins 133 at the proper height so that, after chip block 120A is mounted on the substrate and overmolding is performed, the final product conforms to the established SD standard specification as accurately as possible. In one embodiment, plastic block 121 has a thickness of 1 mm. Note that FIG. 7(A) is a simplified illustration showing the lead frame without tie bars and a support frame for illustrative purposes, and those skilled in the art will recognize how the tie bars and support frame would be attached.

Figure 8A:
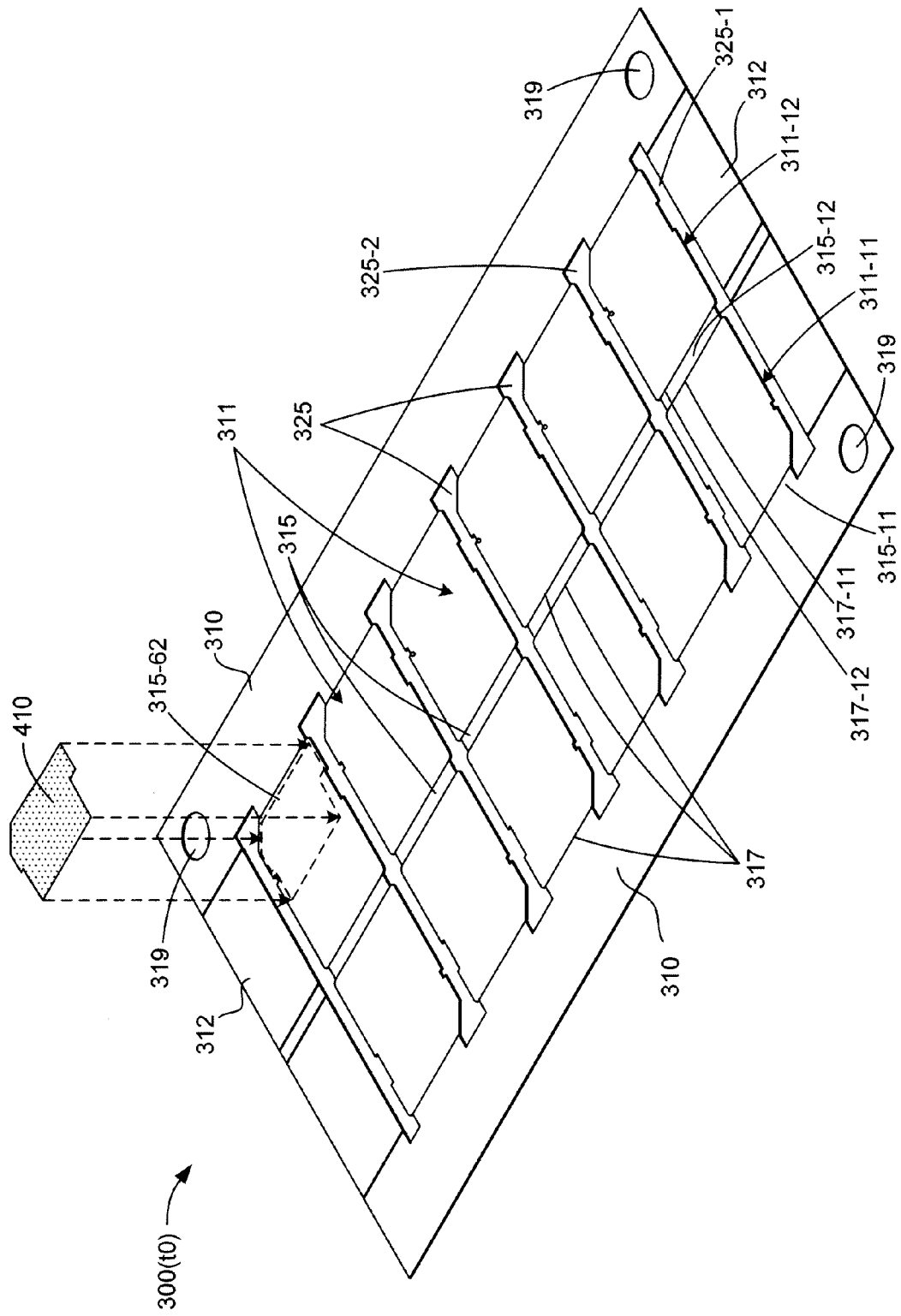
FIGS. 8(A) and 8(B) are exploded top perspective views showing a process of mounting the assembly of FIG. 7(B) onto a substrate panel according to the method of FIG. 6.

FIGS. 8(A) to 13 are simplified top views showing a substrate panel 300 that is utilized in accordance with a specific embodiment of the present invention to facilitate mass production of adaptor cards. In these figures, the suffix "tx" is utilized herein to designated the state of the PCB panel during the manufacturing process, with "t0" designating an initial state. Sequentially higher numbered prefixes (e.g., "t1", "t2" and "t3") indicate that substrate panel 300 has undergone additional sequential production processes. Referring to FIG. 8(A), PCB panel 300($t0$) includes a six-by-two matrix of substrate regions 311 that are surrounded by opposing end border structures 310 and side border structures 312, which are integrally connected to form a rectangular frame of blank material around plastic substrate regions 311. Each substrate region 311 (which corresponds to substrate 110; see FIG. 1(A)) has the features described above with reference to FIGS. 1(A) and 1(B), and the additional features described below. FIG. 8(A) shows upper surface 112 of each substrate region 311, and shows that each substrate region is blank (i.e., has no wire traces printed on it—it is just a plastic substrate panel to use as the lower wall of the adaptor card. In one embodiment each substrate region 311 has a thickness of approximately 3 to 4 mils. Referring to FIG. 8(A), each substrate region 311 in each row is connected to an end border structure 310 and to an adjacent substrate region 311 by way of intervening bridge pieces 315, which are removed after molding is completed (discussed below). For example, referring to the lower row of substrate regions in FIG. 8(A), substrate region 311-11 is connected to the left end border structure 310 by way of bridge piece 315-11 and to substrate region 311-12 by way of bridge piece 315-12. To facilitate their removal, optional designated cut lines 317 are scored or otherwise partially cut into the substrate material at each end of each bridge piece. For example, bridge piece 315-11 includes cut lines 317-11 and 317-12 at the ends thereof. In an alternative embodiment, cut lines 317 may be omitted, or comprise surface markings that do not weaken the panel material. Note that side edges of each substrate region 311 are exposed by elongated slots (openings) 325 that extend between end border regions 310. For example, side edges of substrate sections 311-11 and 311-12 are exposed by elongated punched-out slots (lanes) 325-1 and 325-2. Slots 325 also serve to define the outer dimensions, shape and contour of the longitudinal edge of each completed SD adaptor card. Finally, border structures 310 and 312 are provided with positioning holes 319 to facilitate alignment between panel 300 and the plastic molding die during molded casing formation, as described below.

Figure 8B:
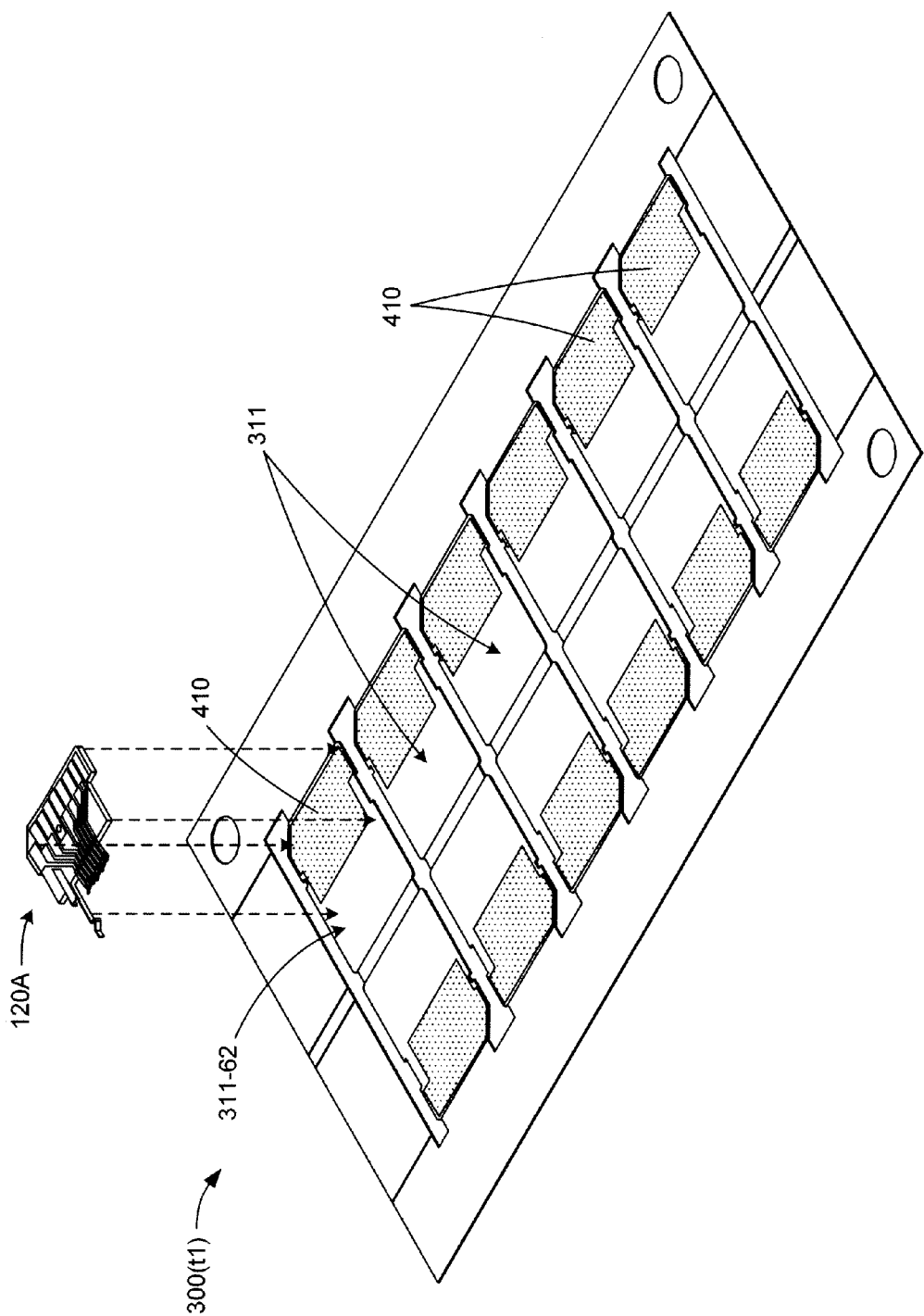
Figure 9:
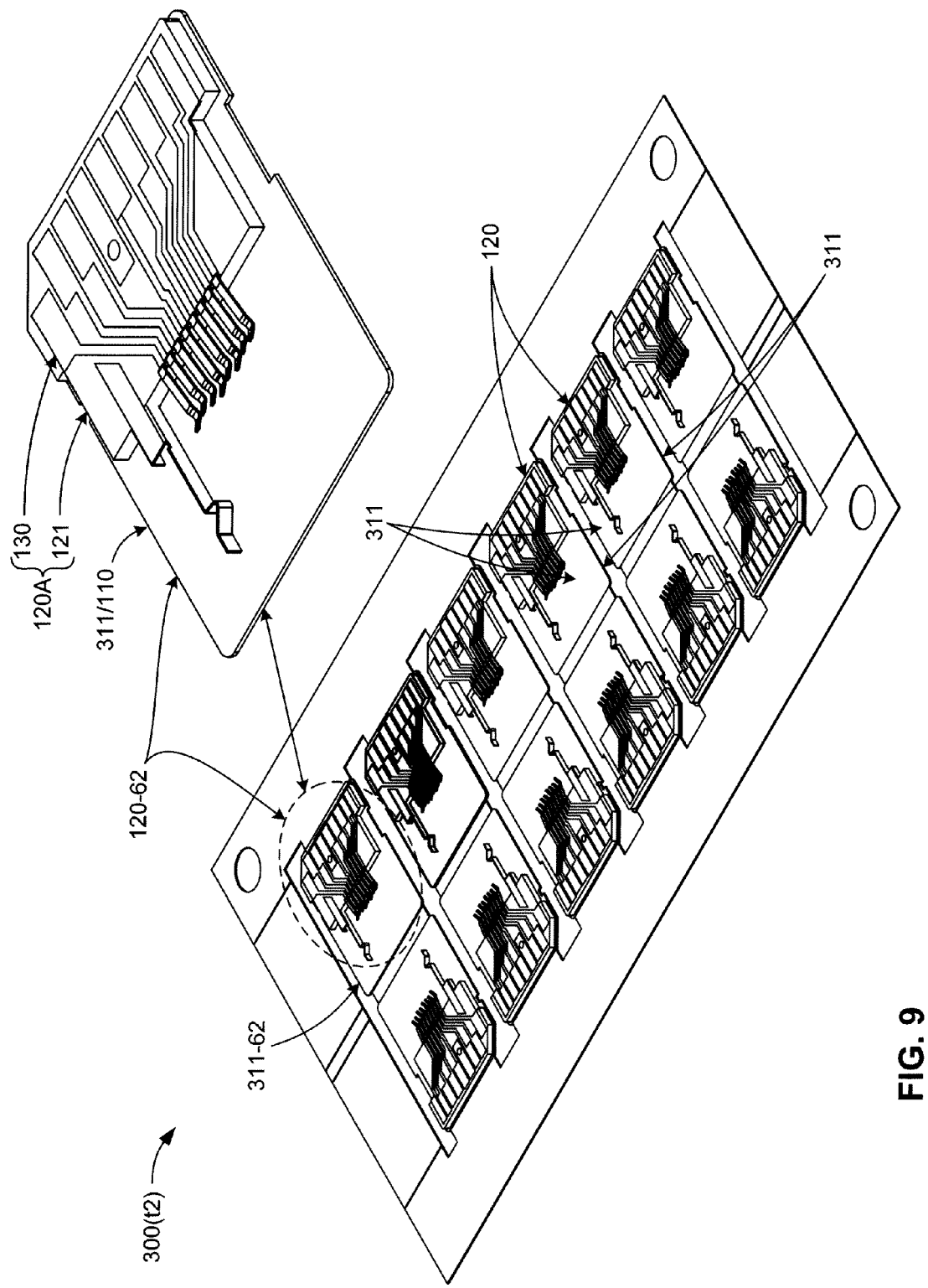
FIG. 9 is a top perspective view depicting the substrate panel of FIG. 8(B) after the assembly mounting process is completed according to the method of FIG. 6.

Sub-processes 217 and 219 of first group 210A (see FIG. 6), which are associated with completing the production of a lead frame/substrate assembly, are illustrated in FIGS. 8(A), 8(B) and 9. Referring to the upper left portion of FIG. 8(A), an adhesive dispensing operation is performed according to block 217 of FIG. 6 by depositing adhesive 410 on a predetermined region (indicated by dashed lines) of substrate regions 311-62. In one embodiment, adhesive 410 has the shape and exact outline of block 121 (shown in FIG. 7(B)). This process is then repeated for each of the remaining substrate regions. FIG. 8(B) depicts panel 300(*t*1) after adhesive patches 410 have been deposited on each substrate region 311, and indicates the beginning of a subsequent process of mounting chip block 120A onto adhesive patches 410 disposed on each substrate region 311 according to block 219 of FIG. 6 in order to form completed assemblies. In particular, FIG. 9 shows chip block 120A mounted onto adhesive patch 410 of substrate region 311-62. This process is then repeated for each of the remaining substrate regions. An optional baking process may be performed if necessary, depending on the type of adhesive used to form adhesive patches 410. FIG. 9 depicts panel 300(*t*2) after chip blocks 120A have been attached to each substrate region 311, there forming completed assemblies 120 on each substrate region 311. As indicated in the upper portion of FIG. 9, each completed assembly (e.g., assembly 120-62) includes a substrate region 311 (corresponding to substrate 110 of the completed card) with a chip block 120A attached thereon, where chip block 120A includes block 121 and lead wire structure 130, as described above.

Figure 10:
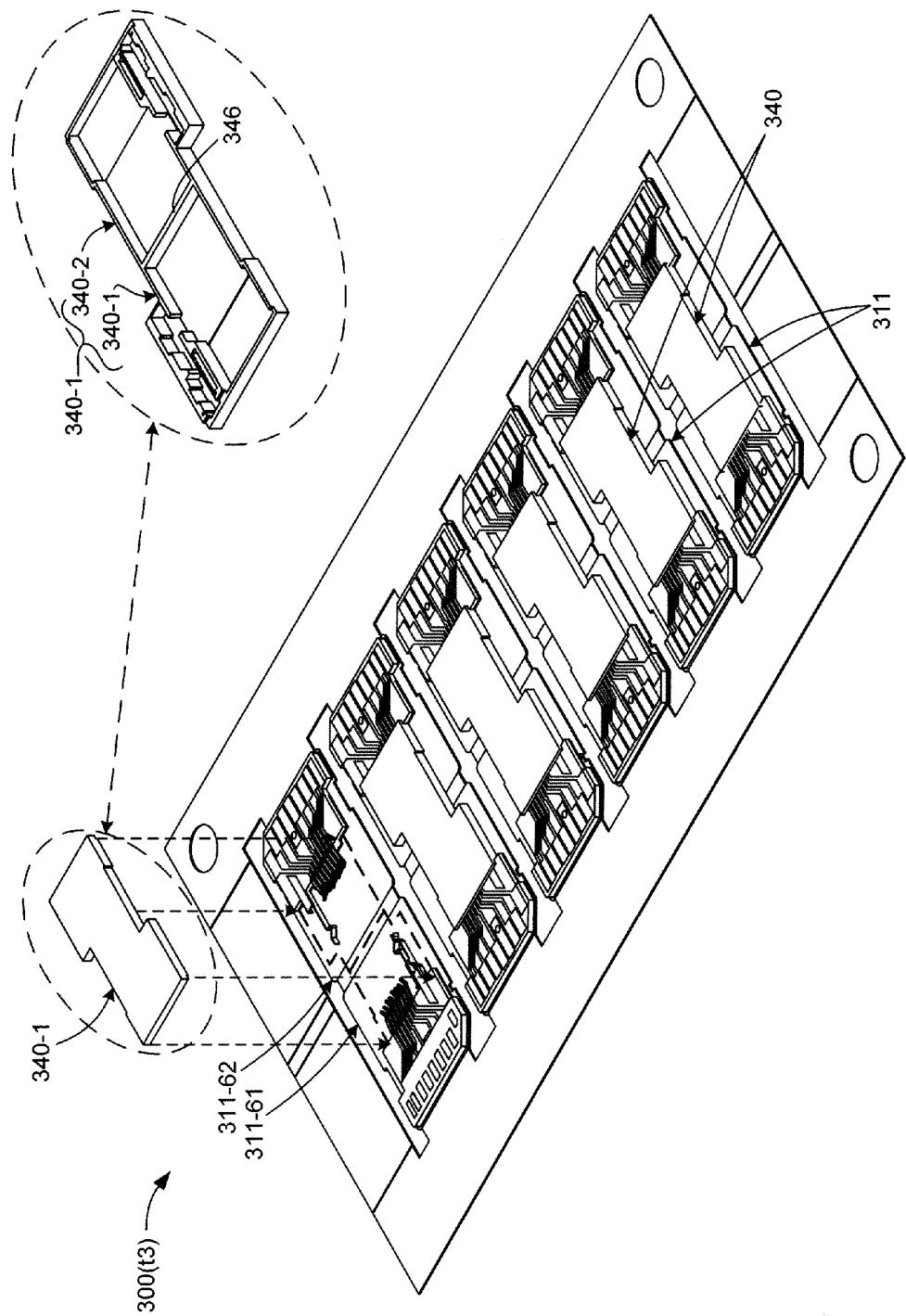
FIG. 10 is a top perspective view depicting the substrate panel of FIG. 9 during a protective cap mounting process according to the method of FIG. 6.

FIG. 10 depicts panel 300(*t*3) during a subsequent process of mounting protective cap structures 340 according to blocks 223 and 225 of FIG. 6. Adhesive is dispensed in the shape and exact outlines of protective cap structures 340 onto substrate regions 311 (e.g., as indicated by the dashed lines on substrate regions 311-61 and 311-62), and then protective cap structures 340 are mounted on the adhesive and baked dry if necessary depending on the type of adhesive applied. As indicated by the dashed-line bubble, in one embodiment each protective cap structure 340 (e.g., protective cap structure 340-1) includes two sections 340-1 and 340-2 having respective side and upper wall structures that are separated by a central partition plastic support 346, which serves to enhance the rigidity of protective cap structure 340-1 so that it would not sag under high mold material injection pressure during molding process.

Figure 11:
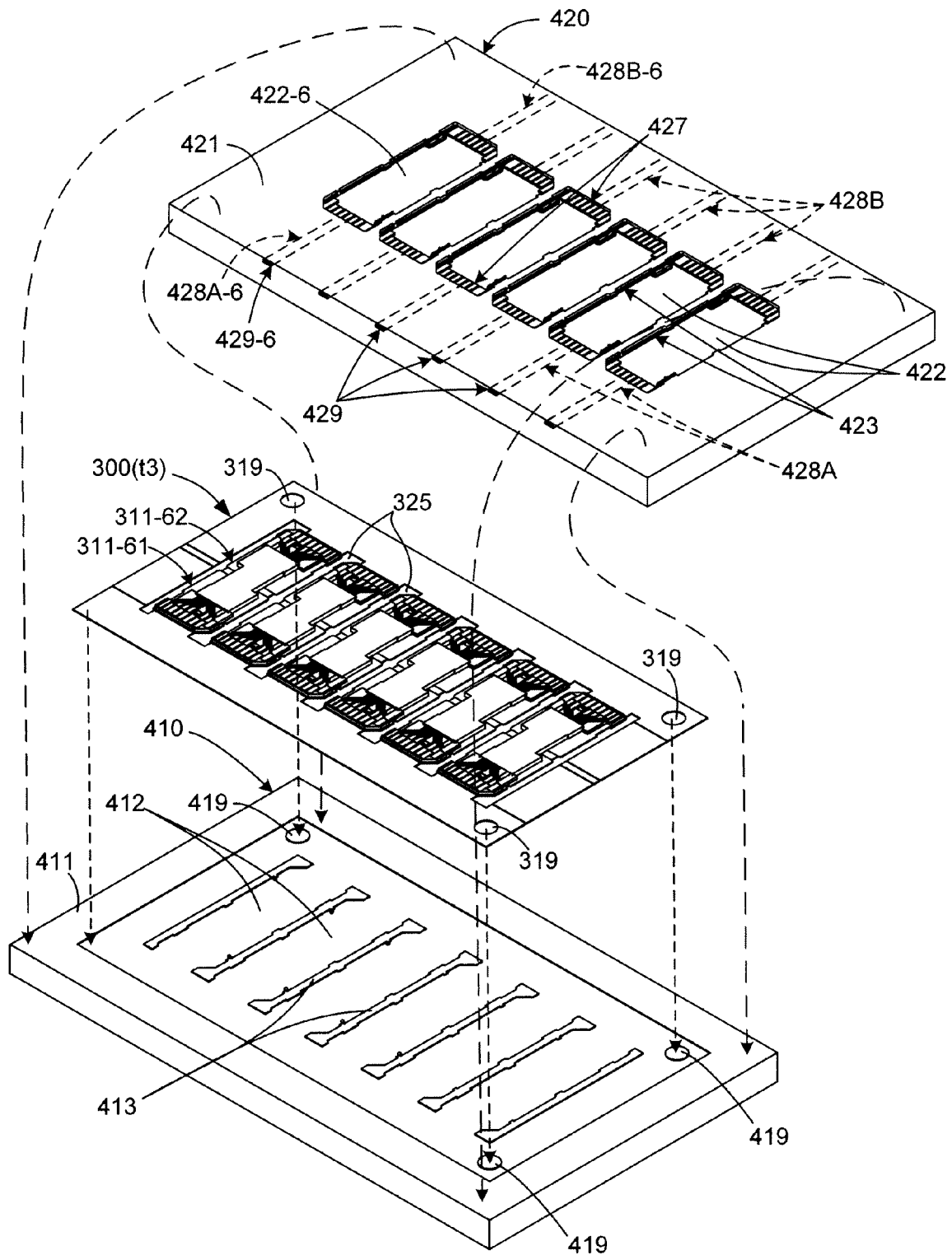
FIG. 11 is an exploded top perspective view depicting the substrate panel of FIG. 9 during installation between mold die according to the method of FIG. 6.

FIG. 11 is an exploded perspective view showing a lower molding die (plate) 410, panel 300(*t*3) of FIG. 10 (i.e., after protective cap structure 340-1 is mounted onto substrate regions 311-61 and 311-62), and an upper molding die 420, which is shown in an inverted (flipped-over) position for illustrative purposes. These structures are assembled as described below in order to perform the plastic molding process according to block 231 of FIG. 6.

Referring to the lower portion of FIG. 11, lower die 410 defines a shallow cavity 412 that is surrounded by a peripheral wall 411 and includes seven raised dividing structures 413 and three positioning pins 419. As indicated by the vertical short-dashed-line arrows, panel 300(*t*3) is mounted into shallow cavity 412 such that raised dividing structures 413 are received inside slots 325, and such that positioning pins 419 are received inside positioning holes 319.

Referring to the upper portion of FIG. 11, upper die 420 defines six cavities 422 that are surrounded by a peripheral wall 421 and by five dividing structures 423. Each cavity 422 is mounted over and encloses two adjacent substrate regions (e.g., cavity 422-6 is mounted over substrate regions 311-61 and 311-62). Run gate sets 428A/428B extend from openings 429 through each cavity 422 in order to facilitate the formation of molded plastic on both sides of panel 300(*t*3) (e.g., run gate set 428A-6/428B-6 extends from inlet opening 429-6 through cavity 422-6 to an outlet opening). As indicated in FIG. 11, each cavity 422 includes structures that serve to form the upper wall, ribs and other features of plastic casing 150, which is described above with reference to FIG. 1. As indicated by the long-dash-line arrows, upper die 420 is inverted and mounted onto lower die 410 prior to initiating the flow of thermoset plastic.

Figure 12:
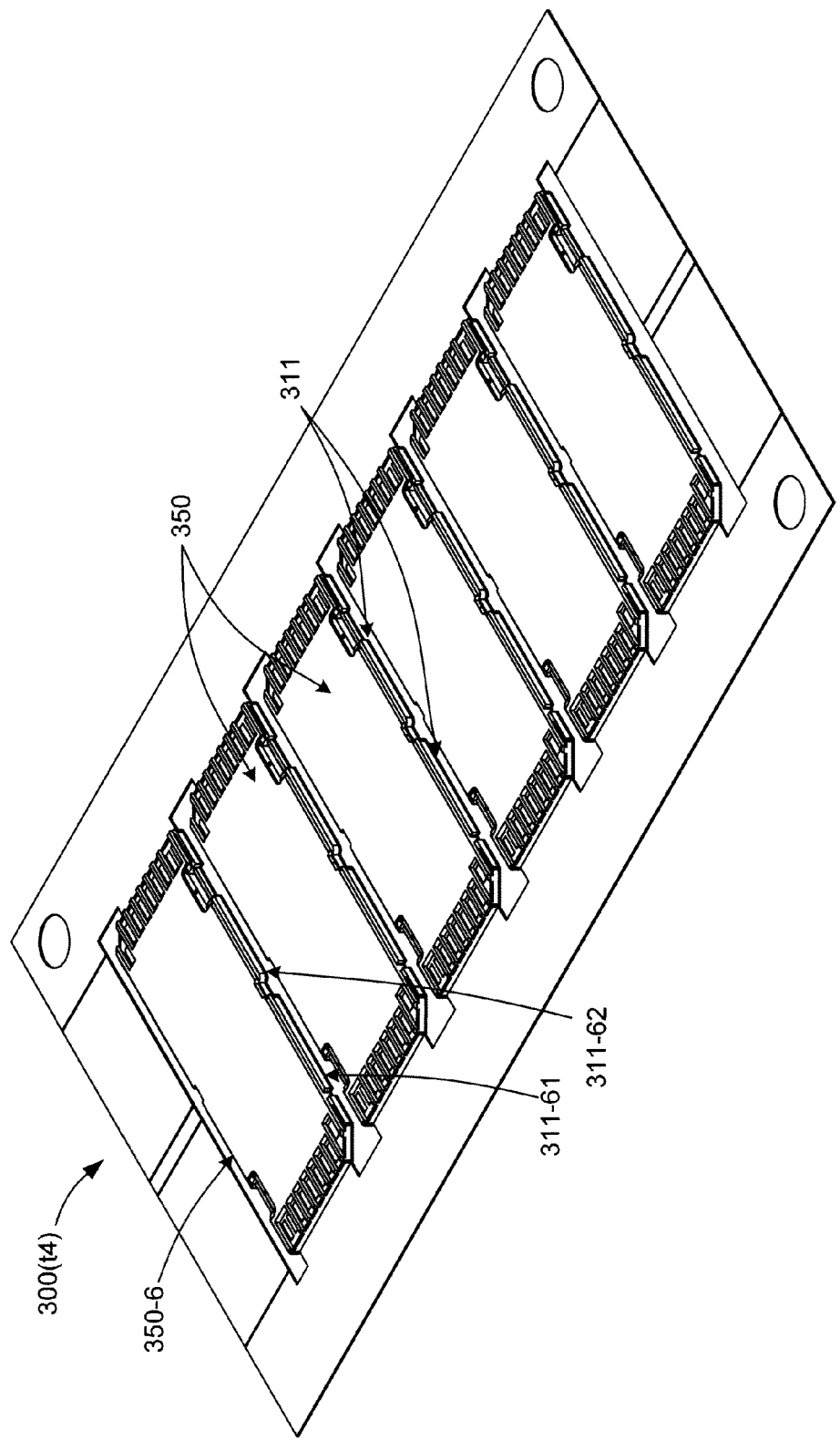
FIG. 12 is a top perspective view depicting the substrate panel of FIG. 9 after a thermoset plastic molding process is performed according to the method of FIG. 6.

FIG. 12 is a top perspective view depicting panel 300(*t*4) after the thermoset plastic molding process is performed and panel 300(*t*4) is removed from the mold die. According to the present embodiment, molded plastic casing structures 350 are formed that extend over each adjacent pair of substrate regions 311. For example, molded plastic casing structures 350-6 extends over substrate regions 311-61 and 311-62. Panel 300(*t*4) includes six molded casing structures 350, wherein each molded casing structure forms a substantially flat upper surface over each substrate region 311.

Figure 13:
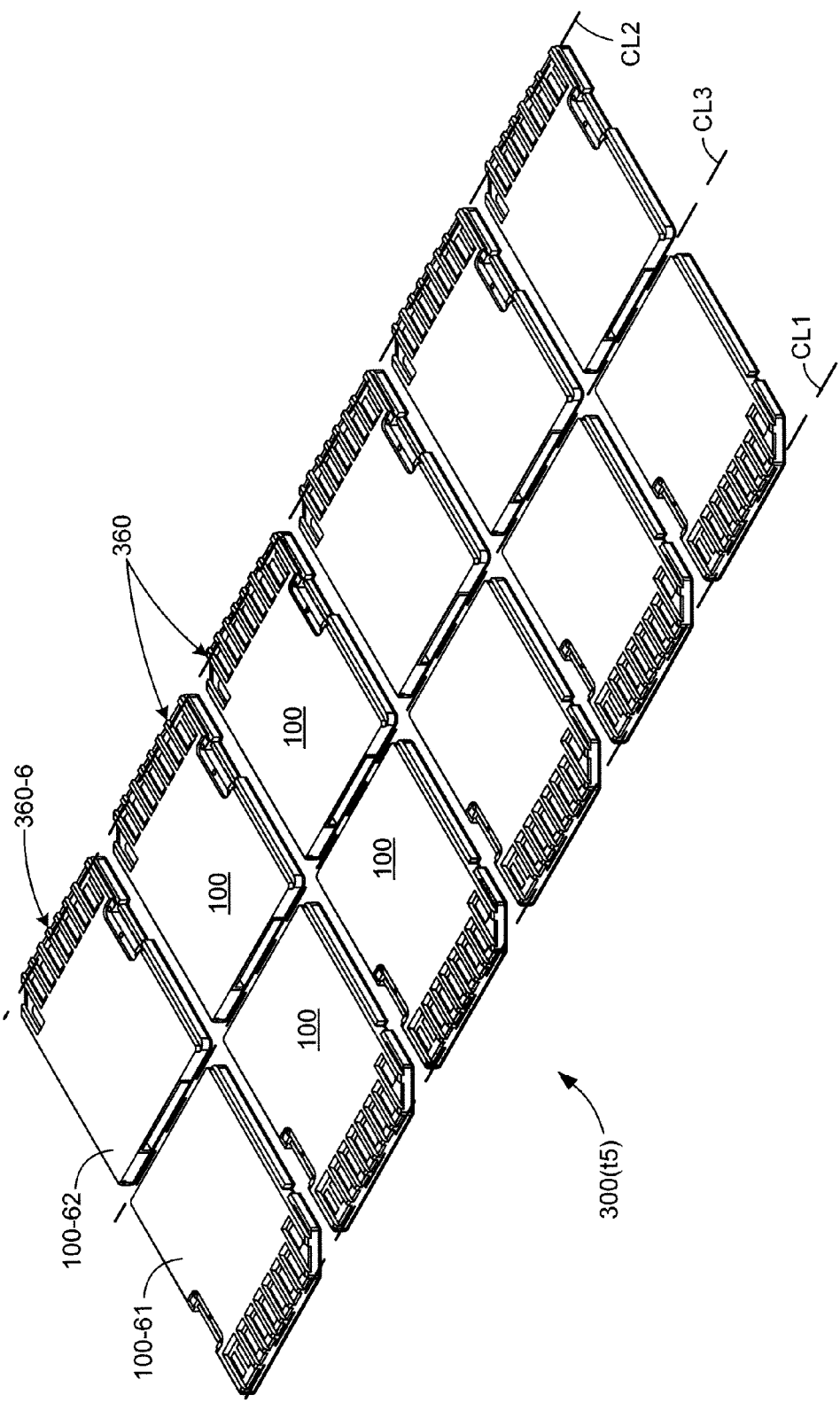
FIG. 13 is a top perspective view depicting the individual adaptor cards separated from the panel of FIG. 10 after a singulation process is performed according to the method of FIG. 6.
Figure 14A:
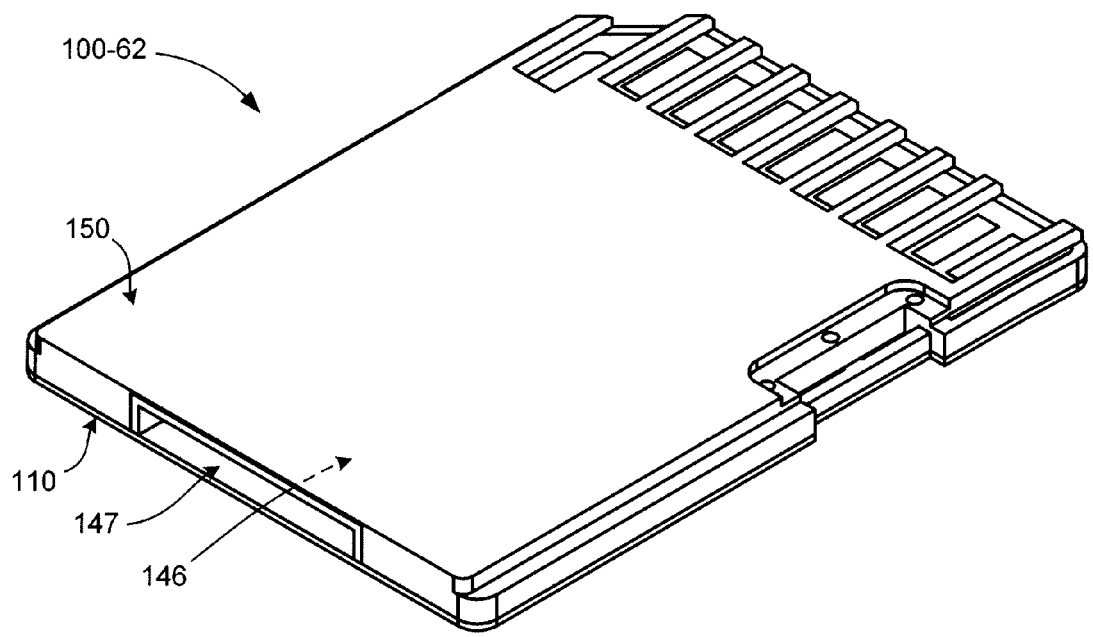
FIGS. 14(A) and 14(B) are top and bottom perspective views, respectively, showing one of the adaptor cards of FIG. 13 in additional detail.
Figure 14B:
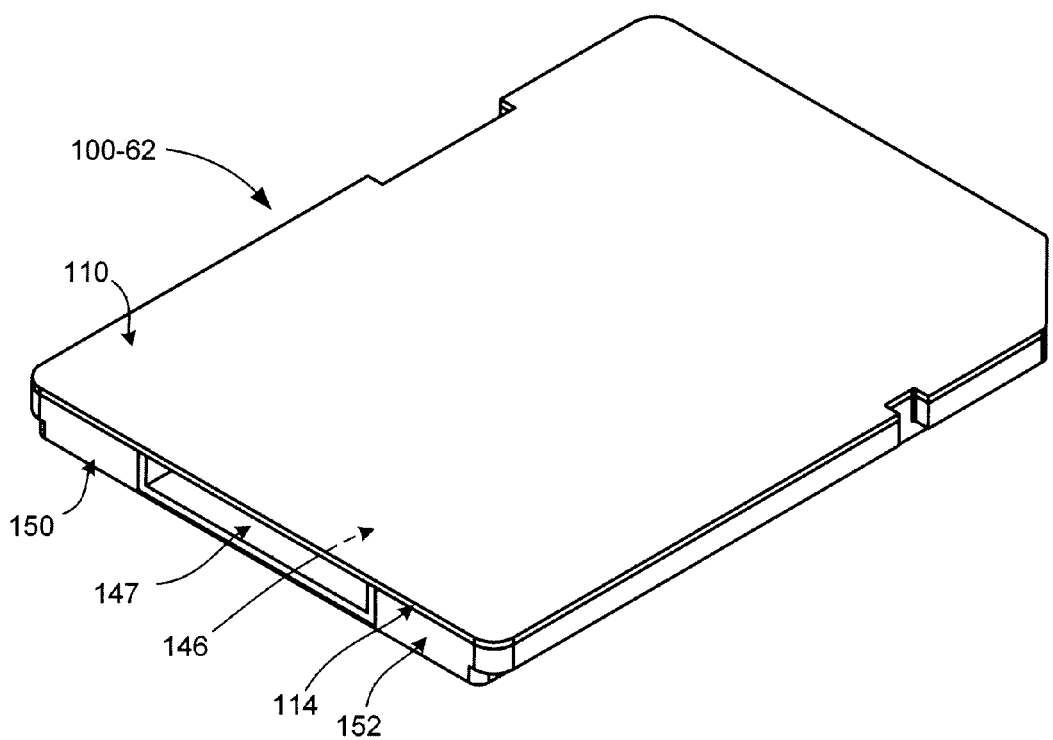

FIG. 13 depicts a subsequent singulation process according to block 233 of FIG. 6, wherein a saw or other cutting device is passed along cut lines CL1 and CL2 to separate the adaptor card sets 360 from the panel support material, and along line CL3 to separate the adaptor card sets 360 into individual adaptor cards 100. For example, adaptor card set 360-6 into separated into individual adaptor cards 100-61 and 100-62. FIGS. 14(A) and 14(B) illustrate adaptor card 100-62 after the singulation process is completed. As indicated, in addition to separating individual adaptor cards 100, the cut performed along cut line CL3 (FIG. 13) also serves to form rear edge 152 of each casing 150 (e.g., by removing central partition plastic support 346, which is described above with reference to FIG. 10), and also to open slot 147 for insertion of a microSD card into cavity 146 the manner described above with reference to FIG. 1(B).

Figure 15A:
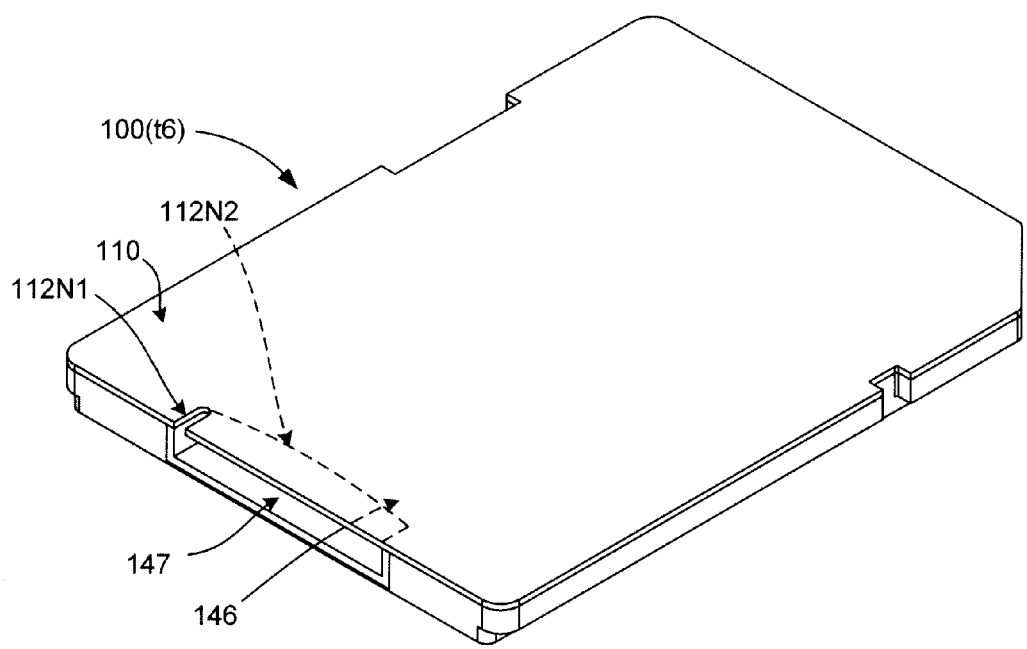
FIGS. 15(A) and 15(B) are bottom perspective views showing the adaptor card of FIG. 14(B) during a notch cutting process performed according to the method of FIG. 6.
Figure 15B:
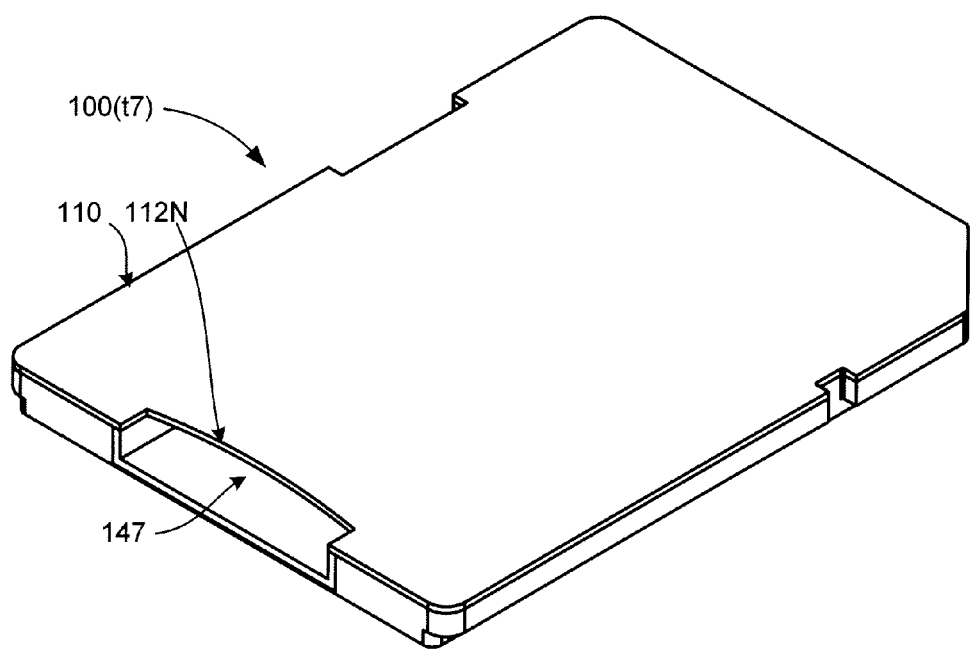

As indicated in FIG. 14(B), which shows adaptor card 100-62 immediately after singulation is completed, rear edge 114 of substrate 110 extends in a straight line across the entire rear edge 152 of casing 150. To facilitate easy insertion and removal of a microSD card into slot 147, a finger nail access notch is then cut into rear edge 114 according to block 235 of FIG. 6. FIGS. 15(A) and 15(B) illustrate the finger nail access notch according to an embodiment. A cutting tool (e.g., saw plate, grinder, water jet cutter or laser cutter) is directed onto substrate 110 to form a partial notch 112N1, and then the cutting tool is turned and directed along dashed line 112N2. The completed finger nail access notch 112N is shown in FIG. 15(B), which facilitates easier insertion and removal of a microSD card into slot 147 by providing a space for the raised rear structure of the microSD card (shown in FIG. 1(B)).

After the finger nail access notch cutting process, an insert-in assembly process is performed to attach write protect switch 190 to molded plastic casing 150 according to block 243 of FIG. 6, and as shown and described above with reference to FIGS. 4 and 5.

Referring to block 250 located at the bottom of FIG. 6, a final procedure in the manufacturing method of the present invention involves testing, packing and shipping the individual adaptor cards, which involves visual inspection and electrical tests consistent with well established techniques. Visually or/and electrically test rejects are removed from the good population as defective rejects. The good adaptor cards are then packed into custom made boxes which are specified by customers. The final packed products will ship out to customers following correct procedures with necessary documents.

Although the present invention has been described with respect to certain specific embodiments, it will be clear to those skilled in the art that the inventive features of the present invention are applicable to other embodiments as well, all of which are intended to fall within the scope of the present invention. For example, FIGS. 16(A) to 18(B) show a second method for producing an adaptor card according to an alternative embodiment of the present invention, as described below.

Figure 16A:
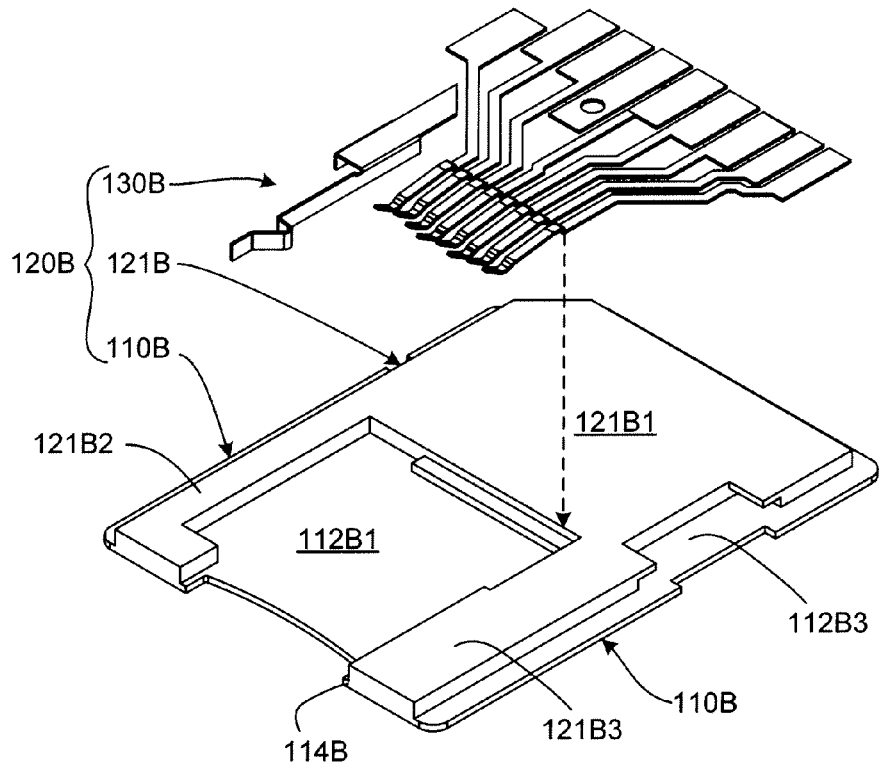
FIGS. 16(A) and 16(B) are exploded top and assembled bottom perspective views, respectively, showing an exemplary microSD-to-SD adaptor card according to another embodiment of the present invention.
Figure 16B:
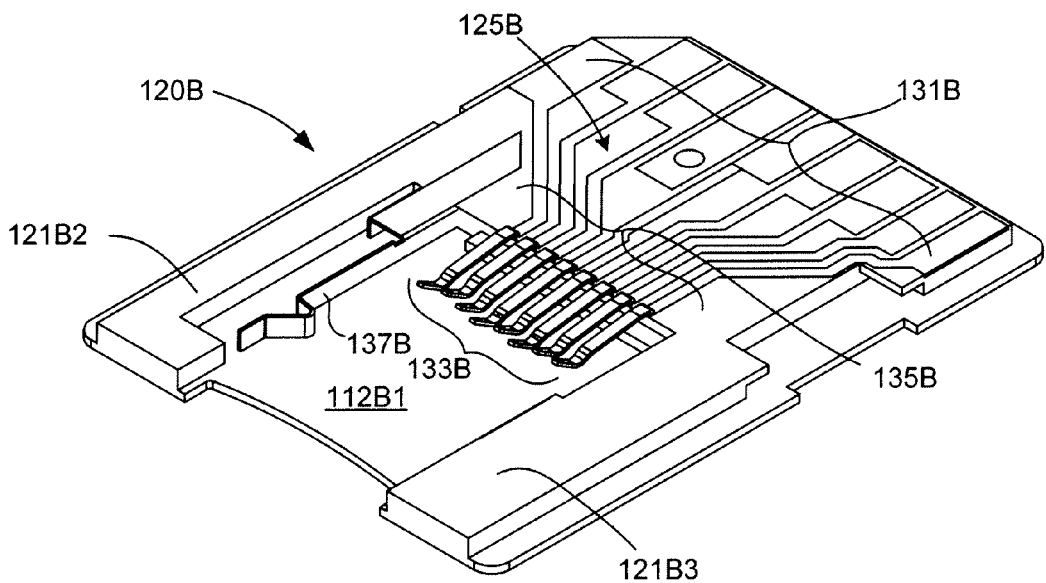

FIGS. 16(A) and 16(B) show an alternative method for forming an assembly 120B including a lower wall (substrate) 110B, a raised structure 121B extending upward from lower wall 110B, and a lead frame structure 130B embedded in raised structure 121B. Raised structure 121B includes a front section 121B1 that is similar in shape and size to block 121 of the previously described embodiment, and two side sections 121B2 and 121B3 extending along side edges of lower wall 110B from front section 121B1 toward rear edge 1114B. Lower wall 110B includes several section that are not covered by raised structure 121B, including a central region 112B1 and side regions. Referring to FIG. 16(B), assembly 120B is formed by simultaneously injection molding lower wall 110B and raised structure 121B onto lead frame 130B such that microSD contact pins 133B and grid anchor pin 137B extend from front section 121B1 over central region 112B1 between side sections 121B2 and 121B3, and SD contact pads 131B and connector wires 135B are exposed on the upper surface of front section 121B1.

Figure 17A:
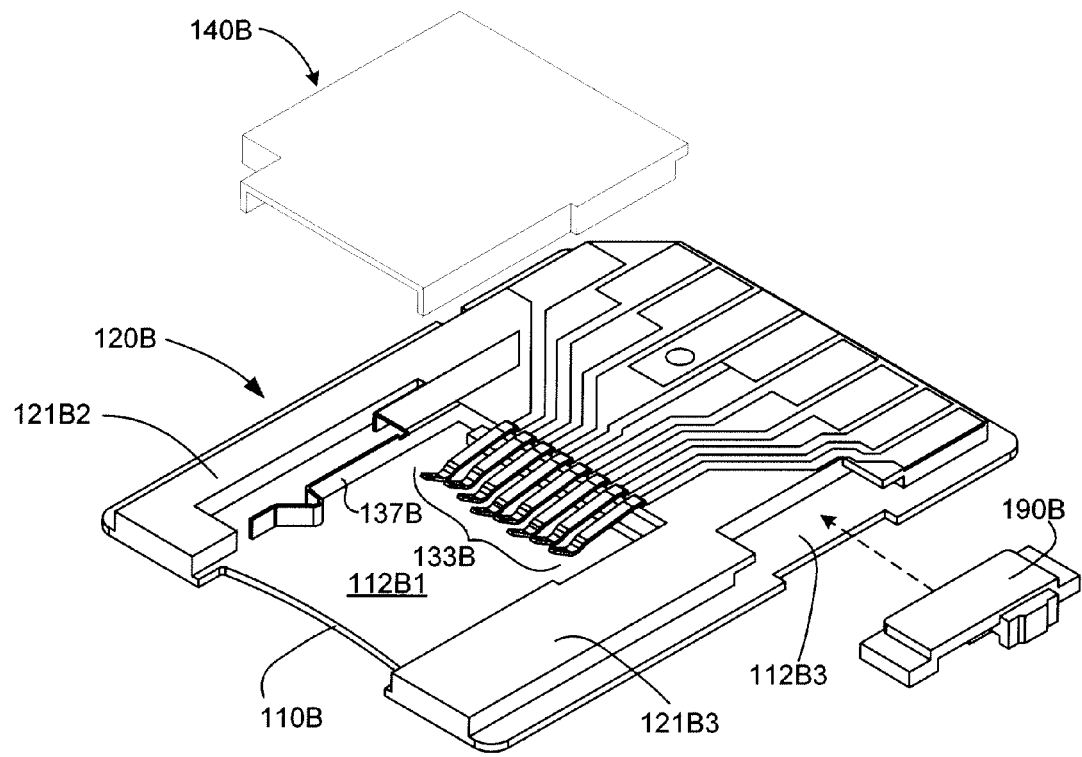
FIGS. 17(A) and 17(B) are exploded and assembled top perspective views, respectively, showing the adaptor card of FIG. 16(B) during a protective cap mounting process according to another embodiment of the present invention.
Figure 17B:
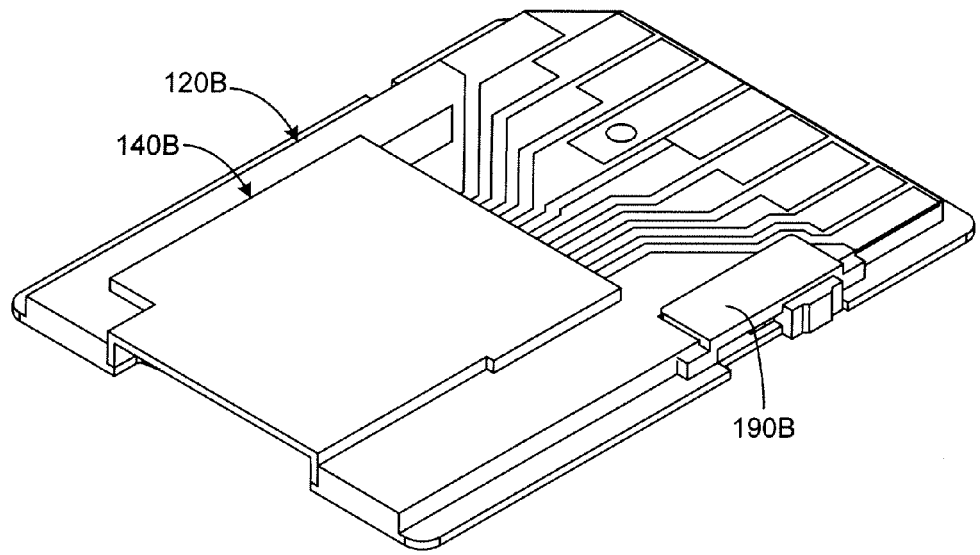
Figure 18A:
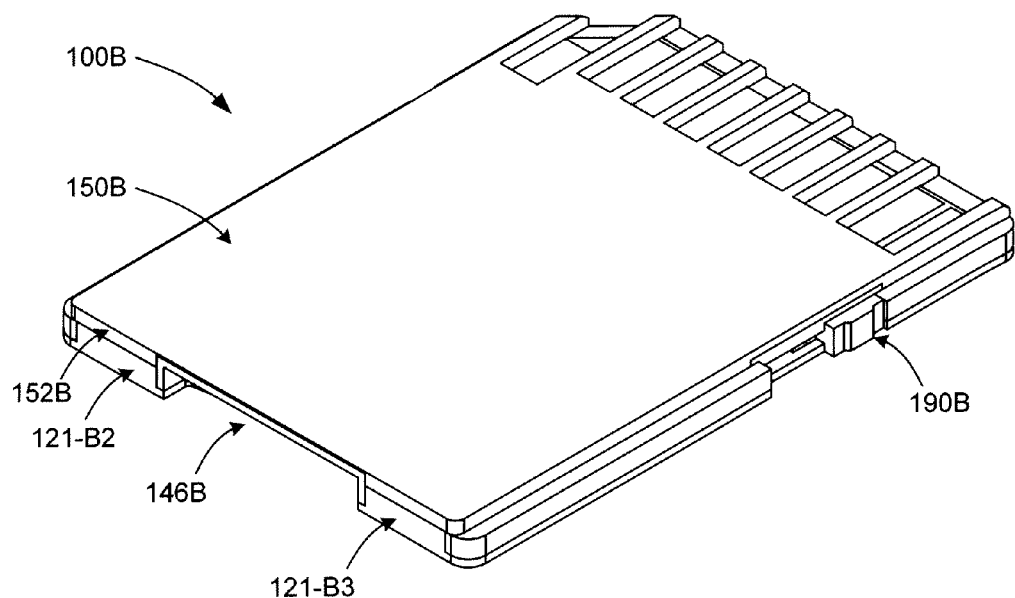
FIGS. 18(A) and 18(B) are top and bottom perspective views, respectively, showing the adaptor card of FIG. 17(B) after a thermoset plastic molding process according to another embodiment of the present invention.
Figure 18B:
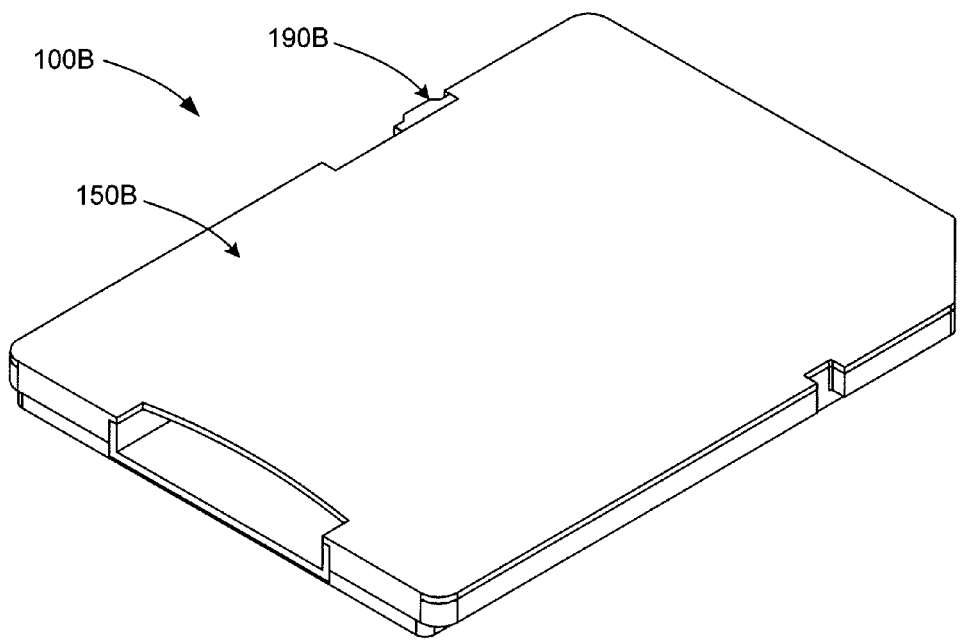

FIGS. 17(A) and 17(B) illustrate an alternative method for mounting a protective cap 140B over the inside surface region 112B1 of assembly 120B, wherein the outer edges of protective cap 140B are bracketed by side sections 121B2 and 121B3. In addition, a pre-molded write protection switch set 190B is mounted into a preformed cavity disposed over a surface region 121B3 of substrate 110B prior to insertion into a molding die. FIGS. 18(A) and 18(B) show top and bottom views of an adaptor card 100B after a thermoset molding process is performed to provide a casing 150B in a manner similar to that described above, wherein the mold is provided with an additional recess for protecting pre-molded write protection switch set 190B during the molding process using known techniques. As indicated in FIG. 18(A), note that rear edge 152B of casing 150B is shorter than in the previous embodiment due to the presence of side 121B2 and 121B3.

The invention claimed is:

1. An adaptor card for adapting a micro-Secure Digital (microSD) card to communicate with a standard Secure Digital (SD) socket disposed on a host system, the adapter card comprising:
a substrate forming a lower wall of the adaptor card, the substrate including a planar outside surface and an opposing inside surface, a front edge and an opposing rear edge;
a lead frame structure fixedly connected to the inside surface of the substrate, the lead frame structure including:
nine SD contact pads disposed on the substrate and located adjacent to the front edge of the substrate, the nine SD contact pads having respective contact surfaces facing away from the substrate and arranged in a standard SD pattern,
eight microSD contact pins supported over the inside surface of the substrate and extending toward the rear edge of the substrate; and
a plurality of connector wires respectively electrically connecting each of the eight microSD contact pins and an associated one of the nine SD contact pads;
a protective cap mounted on the inside surface of the substrate, the protective cap including opposing side walls extending from the inside surface, and an upper wall supported by the side walls and disposed parallel to and spaced from a portion of the inside surface such that the opposing side walls, the upper wall and the inside surface portion define a chamber; and
an integral molded plastic casing consisting essentially of a thermoset plastic and including an upper wall formed on the inside surface of the substrate and over the upper wall of the protective cap such that the protective cap is secured to said substrate by said thermoset plastic,
wherein said upper wall of the molded plastic casing defines a plurality of openings disposed such that each of said nine SD contact pads is exposed through an associated one of the plurality of openings,
wherein a rear edge of the integral molded plastic casing defines a rear opening, and
wherein the eight microSD contact pins are disposed inside the chamber such that, when the microSD card is fully inserted through the rear opening into the chamber, eight contact pads on the microSD card are operably respectively connected to the eight microSD contact pins, whereby electrical signals generated by the microSD card on any of the eight contact pads are transmitted corresponding ones of the nine SD contact pads.

2. The adaptor card according to claim 1,
wherein the protective cap consists essentially of a material having a first melting point temperature, and
wherein said thermoset plastic forming the molded plastic casing has a second melting point temperature that is higher than the first melting point temperature.

3. The adaptor card according to claim 1, wherein both the protective cap and the molded plastic casing consist essentially of an identical thermoset plastic.

4. The adaptor card according to claim 1,
wherein the lead frame structure further comprises a grip anchor pin supported over the inside surface of the substrate and extending toward the rear edge of the substrate, and
wherein the grip anchor pin is disposed inside the chamber such that, when the microSD card is fully inserted through the rear opening into the chamber, the grip anchor pin engages a grip notch disposed on a side edge of the microSD card such that the microSD card is secured inside the chamber.

5. The memory card device according to claim 1, wherein the molded plastic casing further includes a plurality of ribs, each rib being disposed between a corresponding adjacent pair of said openings.

6. The adaptor card according to claim 1, wherein the molded plastic casing and the substrate form a package having length, width and thickness dimensions consistent with an established SD standard.

7. The adaptor card according to claim 1,
wherein the molded plastic casing includes a pre-molded switch slot includes a cavity that is exposed by a first opening defined between first and second portions of said second side wall and a second opening defined in a portion of the upper wall; and a write protect switch assembly mounted onto the molded plastic casing, the write protect switch assembly including:
a movable switch button having a base portion movably engaged in the cavity of the pre-molded switch slot, and a button top extending through the first opening; and
a switch cap secured to the upper wall of the molded plastic casing and having a flat wall portion of the switch cap encloses the second opening such that the base portion of the movable switch button is covered by the flat wall portion.

8. The memory card device according to claim 7,
wherein the pre-molded switch slot further comprises a retention wall extending between the first and second portions of said second side wall, and
wherein the movable switch button further defines a retaining slot and is mounted on the molded plastic casing such that the retention wall is slidably received inside the retaining slot.

9. The memory card device according to claim 7, wherein the retention wall is slidably received inside the retaining slot such that the movable switch button is restricted by the retaining wall to move between the first and second portions of said second side wall.

10. The memory card device according to claim 7,
wherein the pre-molded switch slot further defines a support shelf disposed around an edge of said cavity, and a plurality of retention openings that extend downward into the support shelf,
wherein the switch cap is mounted on the lower wall of the molded plastic casing such that the flat wall portion is disposed on the support shelf, and
wherein the switch cap further comprises a plurality of protrusions, each of the plurality of protrusions being inserted into an associated one of the plurality of retention openings.

11. The memory card device according to claim 10, wherein the switch cap comprises molded plastic and the plurality of protrusions comprise poles.

12. A method for producing an adaptor card for adapting a microSD card to communicate with an SD socket of a host system, the method comprising:
forming an assembly including:
a substrate having a planar outside surface and an opposing inside surface, a front edge and an opposing rear edge; and
a lead frame structure fixedly connected to the inside surface of the substrate, the lead frame structure including:
a plurality of standard Secure Digital (SD) contact pads disposed adjacent to the front edge of the substrate on the substrate and having respective contact surfaces facing away from the substrate,
a plurality of micro-Secure Digital (microSD) contact pins supported over the inside surface of the substrate and extending toward the rear edge of the substrate;
a plurality of connector wires respectively electrically connecting each of the plurality of microSD contact pins and an associated one of the plurality of standard SD contact pads; and
a grip anchor pin supported over the inside surface of the substrate and extending toward the rear edge of the substrate,
mounting a protective cap on the assembly such that opposing side walls and an upper wall of the protective cap define an chamber enclosing the eight microSD contact pins and the grip anchor pin; and
molding thermoset plastic on the inside surface of the substrate, the protective cap, and at least a portion of the lead frame structure to form an integral molded plastic casing arranged such that said protective cap is secured to said substrate by said thermoset plastic and the nine SD contact pads are exposed through openings defined in the molded plastic casing, wherein the protective cap prevents formation of said thermoset plastic in the chamber enclosing the eight microSD contact pins and the grip anchor pin.

13. The method according to claim 12, wherein forming the assembly comprises:
molding a plastic block onto the lead frame structure;
securing the plastic block to the inside surface of the substrate.

14. The method according to claim 13, wherein securing the plastic block to the inside surface of the substrate:
dispensing an adhesive onto the inside surface of the substrate; and
mounting the plastic block onto the adhesive.

15. The method according to claim 12, wherein mounting the protective cap comprises:
dispensing an adhesive onto the inside surface of the substrate; and
mounting the plastic block onto the adhesive.

16. The method according to claim 12,
wherein the substrate is disposed on a panel and is integrally connected to a second substrate;
wherein the method further comprises, after forming the integral molded plastic casing, singulating the panel to separate the substrate from the second substrate.

17. The method according to claim 16,
wherein dispensing said adhesive onto the inside surface of the substrate further includes dispensing said adhesive onto an insides surface of the second substrate,
wherein mounting the plastic block onto the adhesive comprises mounting an elongated plastic block over both the substrate and the second substrate, and
wherein singulating the panel comprises cutting the elongated plastic block into two plastic block portions, each plastic block portion being disposed on an associated one of the substrate and the second substrate.

18. The method according to claim 12, further comprising cutting a finger nail access notch into a rear edge of the integral molded plastic casing.

19. The method according to claim 12,
wherein forming the integral molded plastic casing further comprising forming a pre-molded switch slot including a cavity that is exposed by a first opening defined between first and second portions of a second side wall of the integral molded plastic casing, and a second opening defined in a portion of an upper wall of the integral molded plastic casing, and
wherein the method further comprises installing a write protect switch assembly including mounting a movable switch button such that a base portion of the movable switch button is movably engaged in the cavity of the pre-molded switch slot, and a button top extends through the first opening, and securing a switch cap to the upper wall of the molded plastic casing such that a flat wall portion of the switch cap covers the flat wall portion and encloses the second opening of the pre-molded switch slot.

20. The method according to claim 19,
wherein the pre-molded switch slot further comprises a retention wall extending between the first and second portions of said second side wall, and
wherein mounting the movable switch button includes mounting the movable switch button such that a retention wall is slidably received inside a retaining slot disposed on the movable switch button.

21. The method according to claim 19,
wherein the pre-molded switch slot further defines a support shelf disposed around an edge of said cavity, and a plurality of retention openings that extend downward into the support shelf, and wherein mounting the switch cap comprises mounting the switch cap on the lower wall of the molded plastic casing such that the flat wall portion is disposed on the support shelf, and such that a plurality of protrusions extending from the lower surface of the flat wall portion are respectively inserted into each of the plurality of retention openings.

22. The method according to claim 21, wherein the plurality of protrusions comprise poles, and wherein mounting the switch cap comprises inserting each of the poles into an associated one of the plurality of retention openings.

* * * * *